United States Patent
Park et al.

(10) Patent No.: US 12,288,738 B2
(45) Date of Patent: Apr. 29, 2025

(54) SEMICONDUCTOR DEVICE PACKAGE AND METHOD OF FABRICATING THE SAME

(71) Applicant: Samsung Electronics Co., Ltd., Suwon-si (KR)

(72) Inventors: Younghwan Park, Seongnam-si (KR); Jongseob Kim, Seoul (KR); Jaejoon Oh, Seongnam-si (KR); Soogine Chong, Seoul (KR); Sunkyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/227,850

(22) Filed: Apr. 12, 2021

(65) Prior Publication Data

US 2022/0148948 A1 May 12, 2022

(30) Foreign Application Priority Data

Nov. 12, 2020 (KR) ........................ 10-2020-0150994

(51) Int. Cl.
*H01L 23/495* (2006.01)
*H01L 21/56* (2006.01)
(Continued)

(52) U.S. Cl.
CPC ...... *H01L 23/49562* (2013.01); *H01L 21/561* (2013.01); *H01L 21/568* (2013.01);
(Continued)

(58) Field of Classification Search
CPC ............. H01L 23/4951; H01L 23/4952; H01L 23/49537; H01L 23/40; H01L 29/2003;
(Continued)

(56) References Cited

U.S. PATENT DOCUMENTS

| 6,607,970 B1 | 8/2003 | Wakabayashi |
| 2002/0027257 A1 | 3/2002 | Kinsman et al. |

(Continued)

FOREIGN PATENT DOCUMENTS

| CN | 110310923 A | 10/2019 |
| JP | H08227950 A | 9/1996 |

(Continued)

OTHER PUBLICATIONS

Extended European Search Report dated Oct. 21, 2021, issued in corresponding European Patent Application No. 21168089.7.
(Continued)

*Primary Examiner* — Younes Boulghassoul
*Assistant Examiner* — Quinton A Brasfield
(74) *Attorney, Agent, or Firm* — HARNESS, DICKEY & PIERCE, P.L.C.

(57) ABSTRACT

Provided are a semiconductor device package and/or a method of fabricating the semiconductor device package. The semiconductor device package may include a semiconductor device including a plurality of electrode pads on an upper surface of the semiconductor device, a lead frame including a plurality of conductive members bonded to the plurality of electrode pads, and a mold between the plurality of conductive members.

27 Claims, 37 Drawing Sheets

(51) Int. Cl.
  *H01L 23/00* (2006.01)
  *H01L 23/31* (2006.01)
  *H01L 23/367* (2006.01)
  *H01L 29/20* (2006.01)

(52) U.S. Cl.
  CPC ........ *H01L 23/3107* (2013.01); *H01L 23/367* (2013.01); *H01L 24/16* (2013.01); *H01L 24/94* (2013.01); *H01L 29/2003* (2013.01); *H01L 2224/16245* (2013.01)

(58) Field of Classification Search
  CPC ......... H01L 29/66431; H01L 29/66462; H01L 29/778–7789; H01L 2924/13064; H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/49805; H01L 23/49811–49816; H01L 23/49861; H01L 23/495–49596; H01L 23/49503–49513; H01L 23/045–049; H01L 23/055–057; H01L 29/41725; H01L 29/41733; H01L 29/41791; H01L 29/4175; H01L 29/41766; H01L 29/41775; H01L 29/41783; H01L 21/823475; H01L 21/823871; H01L 21/76895; H01L 21/76897; H01L 21/743; H01L 21/76804; H01L 21/76805; H01L 23/5226; H01L 23/5283; H01L 23/5286; H01L 23/528; H01L 23/481; H01L 23/535; H01L 23/5384; H01L 23/5386; H01L 2224/2969; H01L 2224/2919; H01L 2224/8385–8389
  See application file for complete search history.

(56) References Cited

U.S. PATENT DOCUMENTS

| | | | |
|---|---|---|---|
| 2006/0202320 | A1* | 9/2006 | Schaffer ............ H01L 23/49562 257/E23.044 |
| 2007/0040237 | A1* | 2/2007 | Coyle .................... H01L 24/14 257/E23.044 |
| 2010/0258844 | A1 | 10/2010 | Lidow et al. |
| 2016/0172283 | A1* | 6/2016 | Cho ........................ H01L 24/00 257/499 |
| 2016/0247748 | A1* | 8/2016 | Kinzer ................ H01L 23/3107 |
| 2020/0144161 | A1* | 5/2020 | Shea ................ H01L 23/49541 |
| 2021/0005516 | A1 | 1/2021 | Li |
| 2022/0020677 | A1* | 1/2022 | Yen ................... H01L 23/49562 |

FOREIGN PATENT DOCUMENTS

| | | |
|---|---|---|
| JP | 2003-124240 A | 4/2003 |
| JP | 4422380 B2 | 2/2010 |
| KR | 10-2001-0089726 A | 10/2001 |
| KR | 10-2003-0056400 A | 7/2003 |
| KR | 100891649 B1 | 4/2009 |
| KR | 10-2009-0098072 A | 9/2009 |
| WO | WO-2006/031886 A2 | 3/2006 |

OTHER PUBLICATIONS

Strydom et al., "Impact of Parasitics on GaN-Based Power Conversion" Springer International Publishing AG, part of Springer NAture 2018, p. 123-152.

Mun et al., "Global R&D Status and Future Development Direction of GAN Power Semiconductor", vol. 31, No. 6, ICT Future Core Material Parts Technology Special, p. 1-12, Dec. 1, 2016.

Korean Office Action dated Mar. 1, 2025 for corresponding Korean Patent Application No. 10-2020-0150994 and its English-language translation.

* cited by examiner

SEMICONDUCTOR DEVICE PACKAGE AND METHOD OF FABRICATING THE SAME

CROSS-REFERENCE TO RELATED APPLICATION

This application is based on and claims priority under 35 U.S.C. § 119 to Korean Patent Application No. 10-2020-0150994, filed on Nov. 12, 2020 in the Korean Intellectual Property Office, the disclosure of which is incorporated by reference herein in its entirety.

BACKGROUND

1. Field

The present disclosure relates to semiconductor device packages and/or methods of fabricating semiconductor device packages.

2. Description of Related Art

Nitride semiconductor devices, such as GaN power devices, may be formed on a silicon substrate through a series of semiconductor processes. Semiconductor device packages may be manufactured by performing a wiring process, in which electrodes of semiconductor devices are connected to lead frames through metal wiring, and a molding process, in which an insulating resin is used. In a semiconductor device package manufactured as described above, heat generated from a semiconductor device may be dissipated to the outside through metal wires, a mold, and a silicon substrate, and thus the semiconductor device package may have poor heat dissipation characteristics. In addition, costs and process times may increase because of many wiring processes.

SUMMARY

Provided are semiconductor device packages and/or methods of fabricating the semiconductor device packages.

Additional aspects will be set forth in part in the description which follows and, in part, will be apparent from the description, or may be learned by practice of the presented embodiments of the disclosure.

According to an embodiment, a semiconductor device package includes a semiconductor device having a horizontal channel structure, the semiconductor device including a plurality of electrode pads on an upper surface of the semiconductor device; a lead frame including a plurality of conductive members bonded to the plurality of electrode pads; and a mold between the plurality of conductive members.

In some embodiments, the mold may cover a lateral surface of the lead frame and a lateral surface of the semiconductor device. The mold may further cover a lower surface of the semiconductor device.

In some embodiments, the semiconductor device package may further include a semiconductor substrate and the semiconductor device may be on an upper surface of the semiconductor substrate.

In some embodiments, the mold may cover a lateral surface of the lead frame, a lateral surface of the semiconductor device, and a lateral surface of the semiconductor substrate. A lower surface of the semiconductor substrate may be exposed without being covered by the mold. The mold may cover a lower surface of the semiconductor substrate.

In some embodiments, the semiconductor device package may further include solder bumps on the plurality of conductive members.

In some embodiments, the semiconductor device package may further include a heat sink on the semiconductor device.

In some embodiments, the semiconductor device may include a GaN power device.

In some embodiments, the plurality of electrode pads may include a source electrode pad, a drain electrode pad, and a gate electrode pad.

According to an embodiment, a method of fabricating semiconductor device packages, may include preparing a semiconductor substrate including a plurality of semiconductor devices having a horizontal channel structure; forming a groove in the semiconductor substrate, the groove having a depth to separate the plurality of semiconductor devices from each other; bonding a lead frame structure to the plurality of semiconductor devices, the lead frame structure including a plurality of lead frames; processing the semiconductor substrate to change the semiconductor substrate from a first thickness to a second thickness less than the first thickness; and fabricating a plurality of semiconductor device packages from the semiconductor substrate including the plurality the plurality of semiconductor devices after the processing the semiconductor substrate.

In some embodiments, the semiconductor substrate may include a silicon wafer before the processing the semiconductor substrate, and the lead frame structure may have a shape corresponding to the silicon wafer.

In some embodiments, an upper surface of each of the plurality of semiconductor devices may include a plurality of electrode pads thereon, and each corresponding lead from of the plurality of lead frames may include a plurality of conductive members bonded to the plurality of electrode pads of a corresponding semiconductor device among the plurality of semiconductor devices.

In some embodiments, the groove in the semiconductor substrate may be formed by etching, laser dicing, or blade dicing.

In some embodiments, the processing the semiconductor substrate may be performed by partially removing the semiconductor substrate or entirely removing the semiconductor substrate.

In some embodiments, after bonding the plurality of lead frames to the plurality of semiconductor devices, the method further may include filling a mold between the plurality of conductive members and in the groove. The fabricating the plurality of semiconductor device packages may include cutting the mold filled between the plurality of semiconductor devices.

In some embodiments, the lead frame structure may be attached to and supported by a support substrate.

In some embodiments, after the processing of the semiconductor substrate, the method may further include: filling a mold between the plurality of conductive members and in the groove; and removing the support substrate.

In some embodiments, the mold may cover a lower surface of the semiconductor substrate or lower surfaces of the plurality of semiconductor devices.

In some embodiments, the fabricating the plurality of semiconductor device packages may include cutting the mold filled between the plurality of semiconductor devices.

In some embodiments, the lead frame structure may include a mold filled between the plurality of conductive members of each of the plurality of lead frames.

In some embodiments, the fabricating the plurality of semiconductor device packages may include cutting the mold filled between the plurality of lead frames.

According to an embodiment, a semiconductor device package includes a semiconductor device including a source electrode pad, a drain electrode pad, and a gate electrode pad spaced apart from each other on an upper surface of the semiconductor device; a lead frame including a first conductive member bonded to the source electrode pad, a second conductive member bonded to the drain electrode pad, and a third conductive member bonded to the gate electrode pad, the first conductive member to the third conductive member being spaced apart from each other; and a mold surrounding a lateral surface the first conductive member, a lateral surface of the second conductive member, a lateral surface of the third conductive member.

In some embodiments, the mold may surround a lateral surface of the source electrode pad, a lateral surface of drain electrode pad, and a lateral surface of the gate electrode pad such that the mold fills gaps between the source electrode pad, the drain electrode pad, and the gate electrode pad along the upper surface of the semiconductor device.

In some embodiments, the mold may surround a lateral surface of the semiconductor device.

In some embodiments, the mold may further include a heat sink connected to the semiconductor device.

In some embodiments, the semiconductor device may include a GaN power device.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
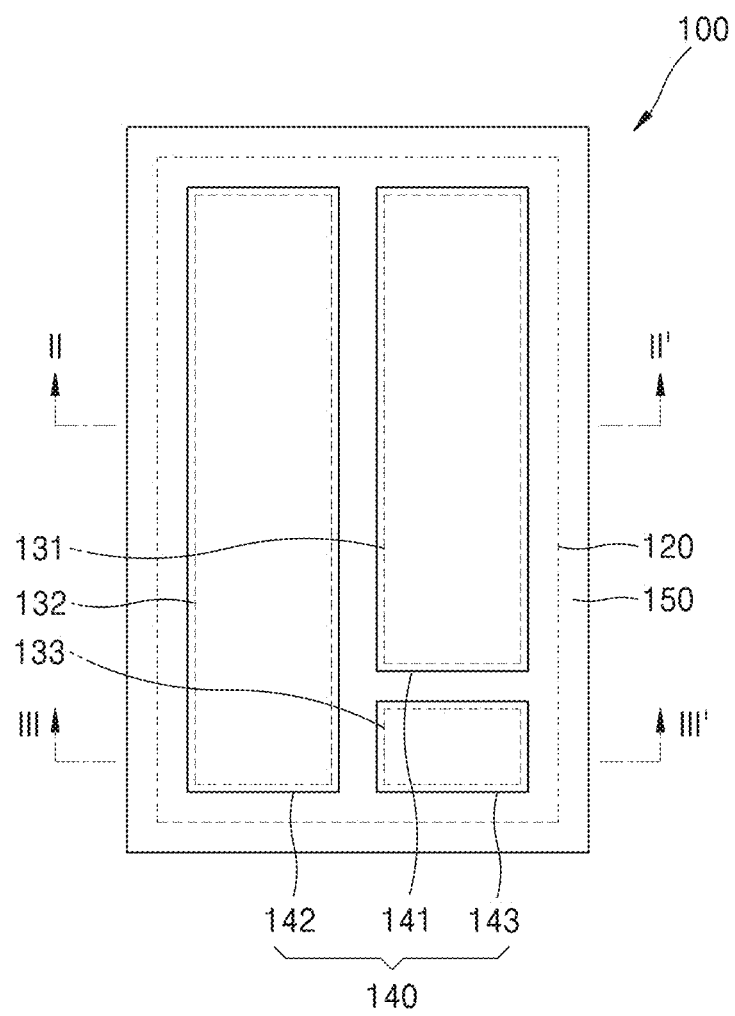
FIG. 1 is a plan view illustrating a semiconductor device package according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or example terms are just used herein to describe technical ideas and should not be considered for purposes of limitation unless defined by the claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
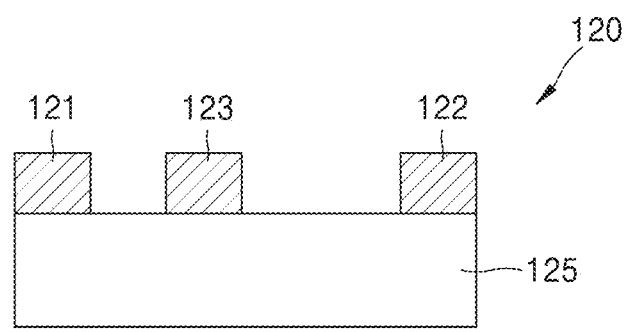
FIG. 2 is a schematic cross-sectional view of the semiconductor device illustrated in FIG. 1.
Figure 3A:
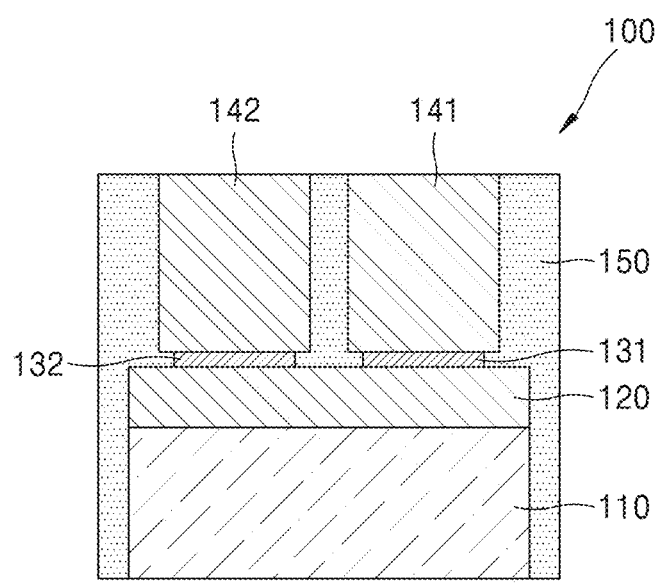
FIG. 3A is a cross-sectional view taken along a line II-II' of FIG. 1.
Figure 3B:
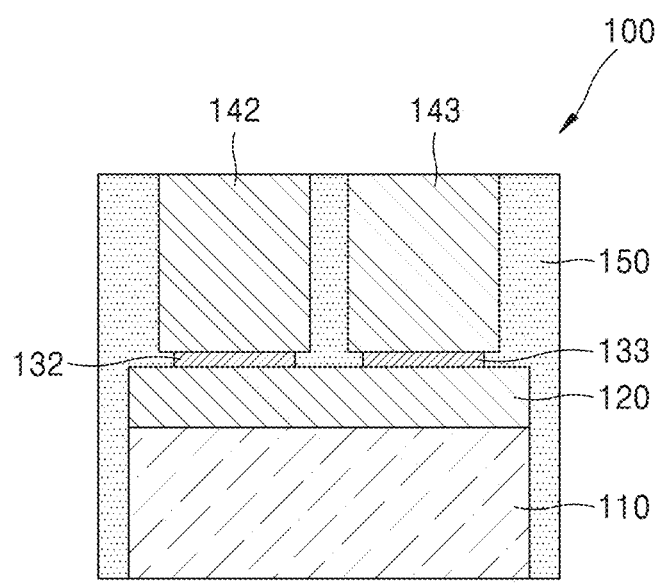
FIG. 3B is a cross-sectional view taken along a line III-III' of FIG. 1.

FIG. 1 is a plan view illustrating a semiconductor device package 100 according to an example embodiment. FIG. 2 is a schematic cross-sectional view of the semiconductor device illustrated in FIG. 1. FIG. 3A is a cross-sectional view taken along line II-II' of FIG. 1, and FIG. 3B is a cross-sectional view taken along line III-III' of FIG. 1.

Referring to FIGS. 1 to 3B, the semiconductor device package 100 includes a semiconductor device 120, a lead frame 140, and a mold 150. The mold 150 also may be referred to as a mold structure.

The semiconductor device 120 may have a horizontal channel structure. In the semiconductor device 120 having a horizontal channel structure, a channel layer (125) may extend in a horizontal direction, and a source electrode (121), a drain electrode (122), and a gate electrode (123) may be arranged on the upper surface of the channel layer.

The semiconductor device 120 may include, for example, a GaN-based semiconductor power device, but is not limited thereto. For example, the semiconductor device 120 may include a high electron mobility transistor (HEMT) having a horizontal channel structure.

The semiconductor device 120 having the above-described horizontal channel structure may be provided on an upper surface of a semiconductor substrate 110. Here, the semiconductor substrate 110 may include, for example, a silicon substrate, but is not limited thereto.

A plurality of electrode pads 131, 132, and 133 may be provided on the semiconductor device 120 having a horizontal channel structure. Here, the plurality of electrode pads 131, 132, and 133 may be provided on a surface of the semiconductor device 120, for example, on an upper surface of the semiconductor device 120. The plurality of electrode pads 131, 132, and 133 may include a source electrode pad 131, a drain electrode pad 132, and a gate electrode pad 133. The source electrode pad 131, the drain electrode pad 132, and the gate electrode pad 133 may be electrically connected to the source electrode (121), the drain electrode (122), and the gate electrode (123) of the semiconductor device 120, respectively.

The lead frame 140 may be provided on upper surfaces of the plurality of electrode pads 131, 132, and 133. The lead frame 140 may include a plurality of conductive members 141, 142, and 143 that are directly bonded to the plurality of electrode pads 131, 132, and 133, respectively. Bonding between the plurality of conductive members 141, 142, and 143 and the plurality of electrode pads 131, 132, and 133 may be performed by, for example, metal-to-metal bonding or solder bonding. However, these bonding methods are examples, and various other bonding methods may be used.

Each of the plurality of conductive members 141, 142, and 143 may include a material having thermal and electrical conductivity. For example, the plurality of conductive members 141, 142, and 143 may include copper (Cu), but are not limited thereto.

The plurality of conductive members 141, 142, and 143 may include first, second, and third conductive members 141, 142 and 143. Here, the first conductive member 141 may be bonded to the source electrode pad 131, the second conductive member 142 may be bonded to the drain electrode pad 132, and the third conductive member 133 may be bonded to the gate electrode pad 143. The first, second, and third conductive members 141, 142, and 143 may have shapes which respectively correspond to the source electrode pad 131, the drain electrode pad 132, and the gate electrode 133. The lead frame 140 including the plurality of conductive members 141, 142, and 143 may be provided on an inner side of the semiconductor device 120. For example, the outer edge of the lead frame 140 may be located in an inner region of the semiconductor device 120. However, this is a non-limiting example.

The mold 150 may be provided around the semiconductor substrate 110, the semiconductor device 120, and the lead frame 140. For example, the mold 150 may be provided to fill gaps between the plurality of conductive members 141, 142, and 143 of the lead frame 140, and cover lateral surfaces of the lead frame 140. In addition, the mold 150 may be provided to cover upper and lateral surfaces of the semiconductor device 120, and lateral surfaces of the semiconductor substrate 110. An upper surface of the lead frame 140 and a lower surface of the semiconductor substrate 110 may be exposed without being covered by the mold 150.

The mold 150 may include an electrically insulating resin, for example, an epoxy resin. For example, the mold 150 may include an epoxy molding compound (EMC) or a liquid molding compound (LMC), but is not limited thereto.

In the semiconductor device package 100 of the present embodiment, the plurality of electrode pads 131, 132, and 133 and the lead frame 140 (the plurality of conductive members 141, 142, and 143) are directly bonded to each other without using metal wiring, thereby making it possible to effectively discharge heat generated from the semiconductor device 120 to the outside and reduce parasitic inductance caused by metal wiring. In addition, since the mold 150 protects the lead frame 140, the semiconductor device 120, and the semiconductor substrate 110, the durability of the semiconductor device package 100 may be improved against electrical and mechanical shocks, and a processing process (described later) may easily be performed on the semiconductor substrate 110.

Figure 4:
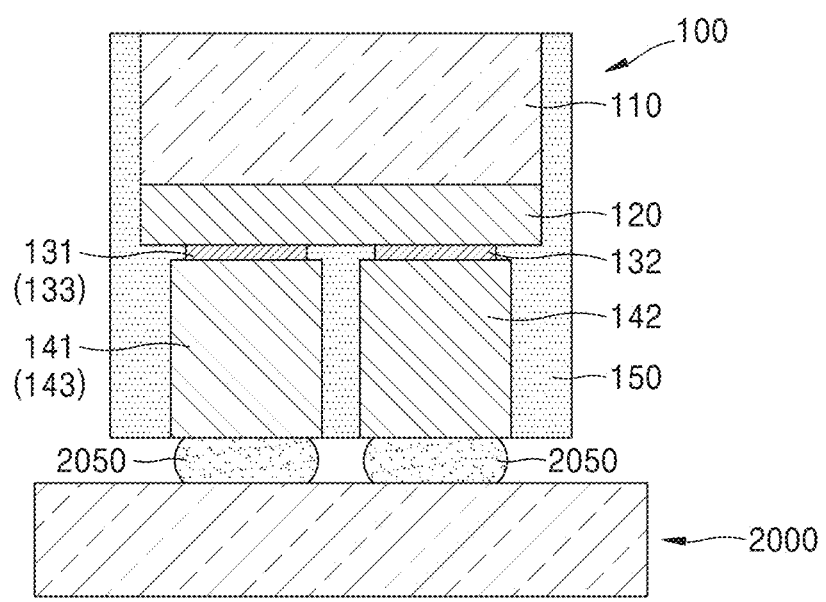
FIG. 4 is a view illustrating a state in which the semiconductor device package shown in FIG. 1 is attached to a printed circuit board.

The semiconductor device package 100 described above may be mounted on a printed circuit board 2000 as shown in FIG. 4. Here, the plurality of conductive members 141, 142, and 143 of the lead frame 140 may be bonded to circuit patterns (not shown) of the printed circuit board 2000 through solder 2050.

Figure 5:
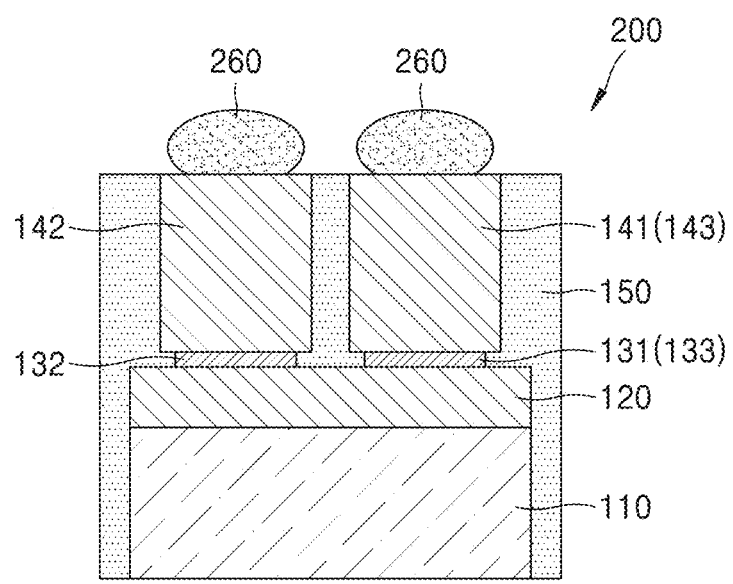
FIG. 5 is a view illustrating a semiconductor device package according to another example embodiment.

FIG. 5 is a view illustrating a semiconductor device package 200 according to another example embodiment. The semiconductor device package 200 shown in FIG. 5 is the same as the semiconductor device package 100 shown in FIG. 1 except that solder bumps 260 are respectively provided on upper surfaces of conductive members 141, 142, and 143 of a lead frame 140. The solder pumps 260 shown in FIG. 5 may be used to bond the semiconductor device package 200 to a printed circuit board 2000 (refer to FIG. 3).

Figure 6:
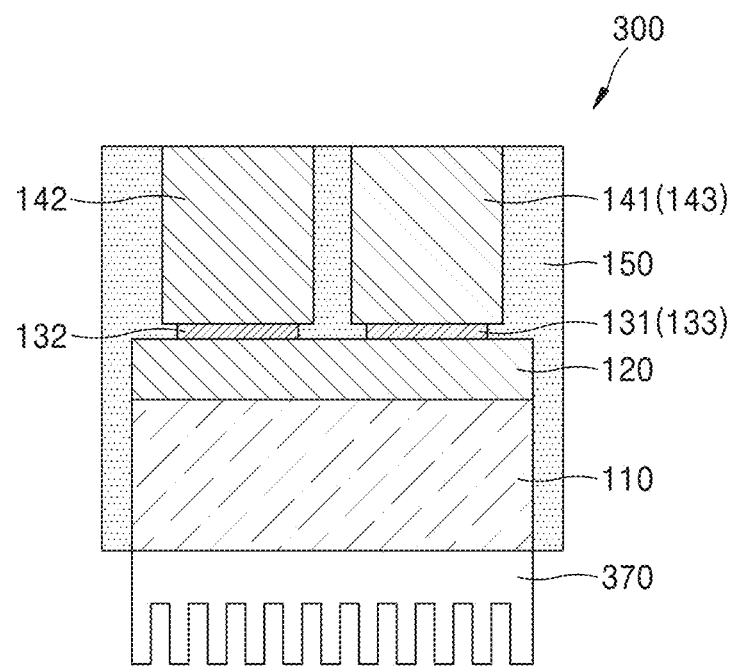
FIG. 6 is a view illustrating a semiconductor device package according to another example embodiment.

FIG. 6 is a view illustrating a semiconductor device package 300 according to another example embodiment. The semiconductor device package 300 shown in FIG. 6 is the same as the semiconductor device package 100 shown in FIG. 1 except that a heat sink 370 is provided on a lower surface of a semiconductor substrate 110.

Referring to FIG. 6, heat generated from a semiconductor device 120 may be effectively discharged to the outside through the semiconductor substrate 110 and the heat sink 370. The heat sink 370 may include a material having high thermal conductivity. The heat sink 370 may further include radiation fins to facilitate heat dissipation.

Figure 7:
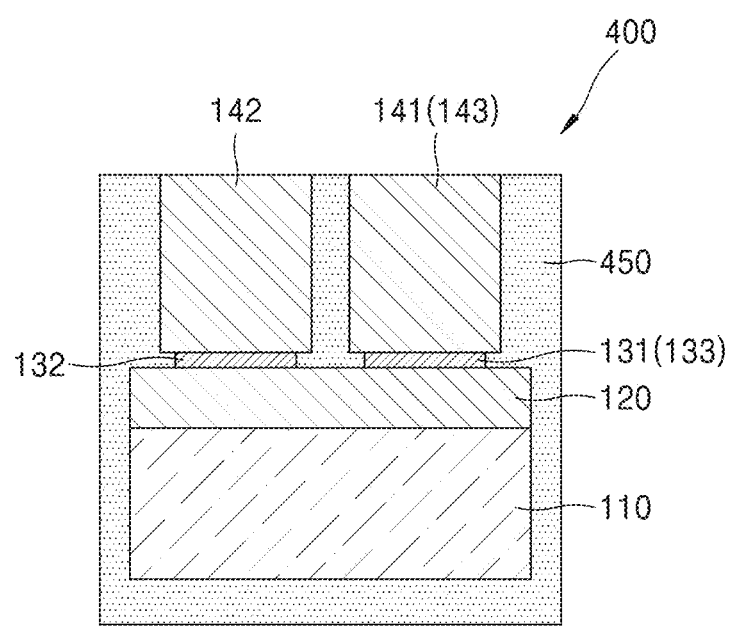
FIG. 7 is a view illustrating a semiconductor device package according to another example embodiment.

FIG. 7 is a view illustrating a semiconductor device package 400 according to another example embodiment. The semiconductor device package 400 shown in FIG. 7 is the same as the semiconductor device package 100 shown in FIG. 1 except that a mold 450 covers a lower surface of a semiconductor substrate 110 as well.

Referring to FIG. 7, the mold 450 may be provided to fill gaps between conductive members 141, 142, and 143 of a lead frame 140, and cover lateral surfaces of the lead frame 140. In addition, the mold 450 may also cover upper and lateral surfaces of a semiconductor device 120 and lateral and lower surfaces of the semiconductor substrate 110. The mold 450 may further improve the durability of the semiconductor device package 400.

Figure 8:
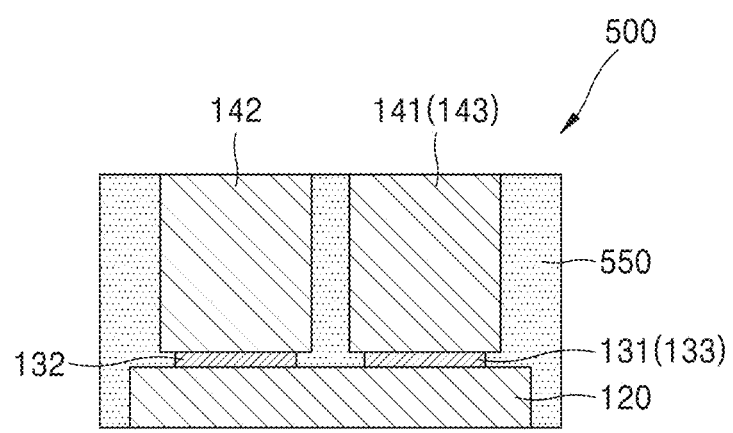
FIG. 8 is a view illustrating a semiconductor device package according to another example embodiment.

FIG. 8 is a view illustrating a semiconductor device package 500 according to another example embodiment. The semiconductor device package 500 shown in FIG. 8 is the same as the semiconductor device package 100 shown in FIG. 1 except that a semiconductor device 120 is not provided with a semiconductor substrate (refer to 110 in FIG. 2).

Referring to FIG. 8, a mold 550 may be provided to fill gaps between conductive members 141, 142, and 143 of a lead frame 140, and cover lateral surfaces of the lead frame 140. In addition, the mold 550 may cover upper and lateral surfaces of the semiconductor device 120. An upper surface of the lead frame 140 and a lower surface of the semiconductor device 120 may be exposed to the outside without being covered by the mold 550. However, although not shown in FIG. 8, the mold 550 may be provided to additionally cover the lower surface of the semiconductor device 120.

Figure 9:
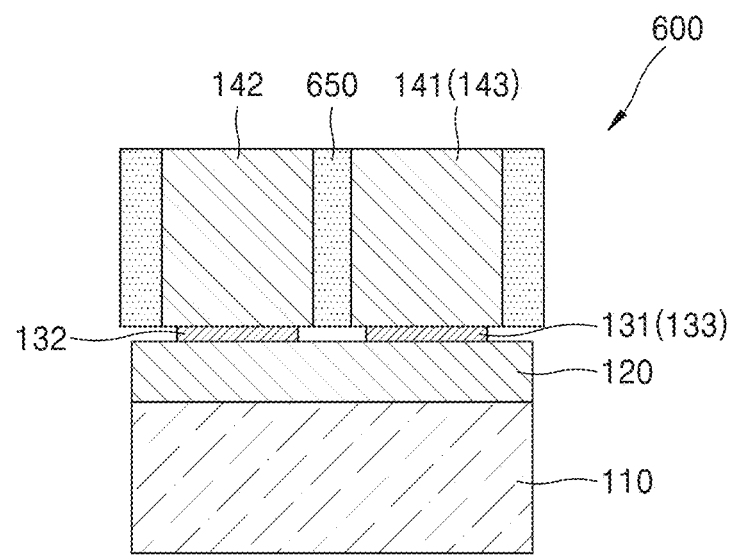
FIG. 9 is a view illustrating a semiconductor device package according to another example embodiment.

FIG. 9 is a view illustrating a semiconductor device package 600 according to another example embodiment. The semiconductor device package 600 shown in FIG. 9 is the same as the semiconductor device package 100 shown in FIG. 1 except that a mold 650 is provided on only a lead frame 140.

Referring to FIG. 9, a plurality of electrode pads 131, 132, and 133 provided on an upper surface of a semiconductor device 120 are bonded to conductive members 14, 142, and 143 of the lead frame 140. Here, the mold 650 may be provided to fill gaps between the conductive members 14, 142, and 143 of the lead frame 140, and cover lateral surfaces of the lead frame 140. Here, lateral surfaces of a semiconductor device 120, and lateral and lower surfaces of a semiconductor substrate 110 may be exposed.

Hereinafter, methods of fabricating semiconductor device packages using a wafer level packaging process will be described.

FIGS. 10 to 19 are views illustrating a method of fabricating semiconductor device packages according to an example embodiment.

Figure 10:
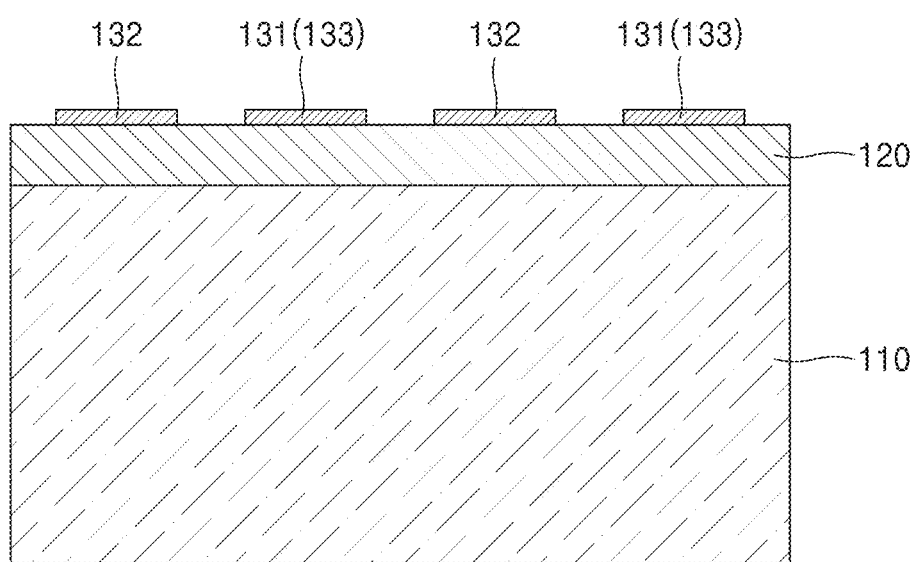
FIGS. 10 to 19 are views illustrating a method of fabricating semiconductor device packages, according to an example embodiment.

Referring to FIG. 10, a semiconductor substrate 110 on which a plurality of semiconductor devices 120 are provided is prepared. When a wafer level packaging process is used, the semiconductor substrate 110 may be a silicon wafer.

Figure 11:
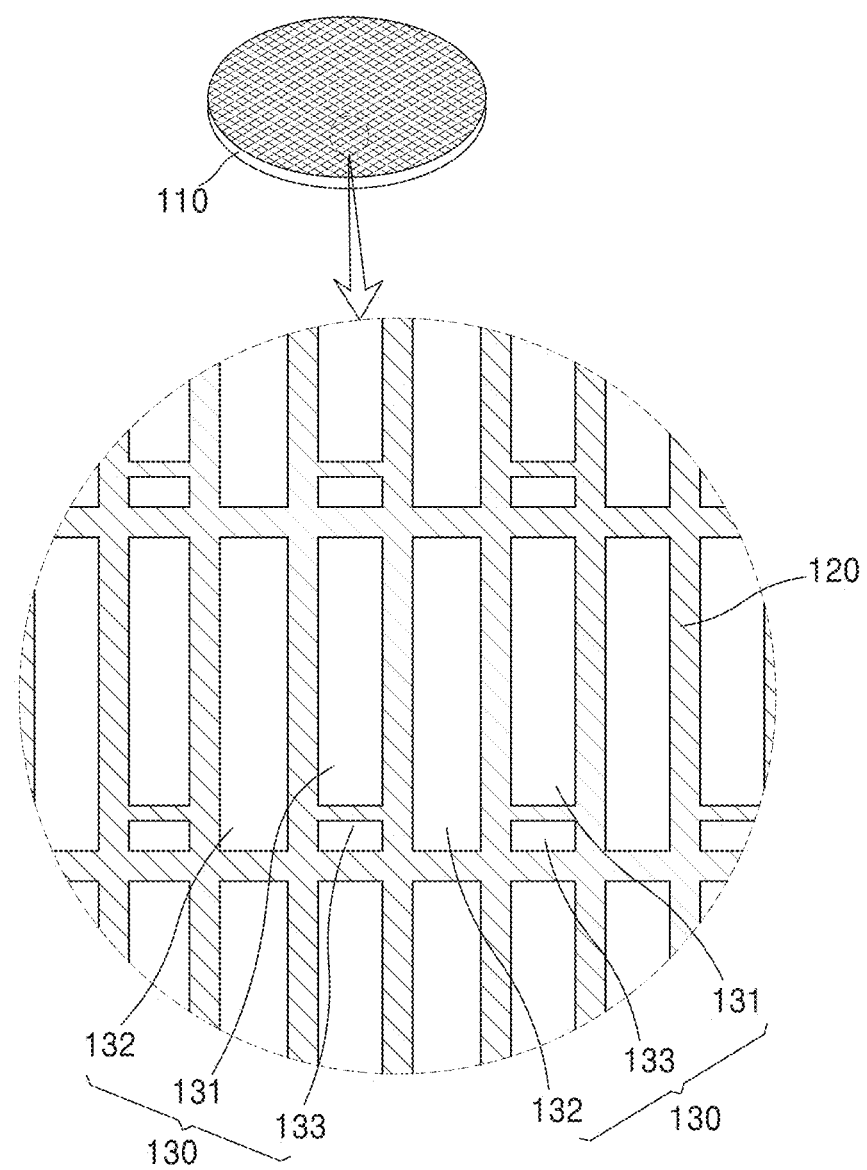

FIG. 11 illustrates the case in which the manipulation part 110 on which the semiconductor devices 120 are provided is a silicon wafer. For example, the silicon wafer may have a diameter of about 8 inches and a thickness of about 750 µm or more. However, this is merely an example, and the diameter and thickness of the silicon wafer may be variously modified. The semiconductor devices 120 are provided on an upper surface of the semiconductor substrate 110.

Each of the semiconductor devices 120 may have a horizontal channel structure as described above. The semiconductor devices 120 may include, for example, GaN-based semiconductor power devices, but are not limited thereto. For example, the semiconductor devices 120 may include HEMTs having a horizontal channel structure or a vertical channel structure.

A plurality of electrode pads 131, 132, and 133 are provided on an upper surface of each of the semiconductor devices 120. The plurality of electrode pads 131, 132, and 133 may include a source electrode pad 131, a drain electrode pad 132, and a gate electrode pad 133.

Figure 12:
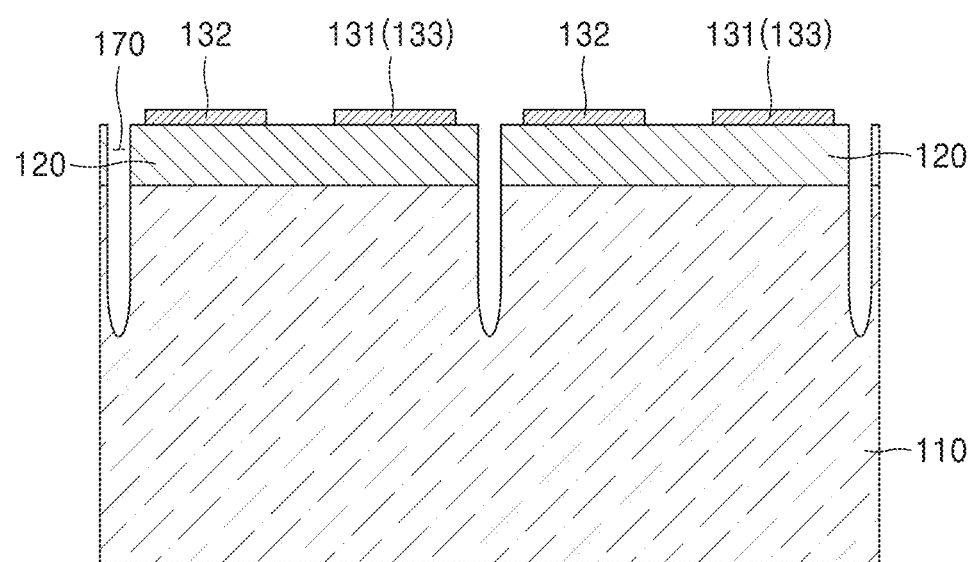

Referring to FIG. 12, grooves 170 for separating the semiconductor devices 120 are formed to a desired and/or alternatively predetermined depth in the semiconductor substrate 110. The grooves 170 may be formed by etching, laser dicing, or blade dicing. The grooves 170 may be formed through material layers (not shown) between the semiconductor devices 120 and may have a desired and/or alternatively predetermined depth from the upper surface of the semiconductor substrate 110.

Figure 13:
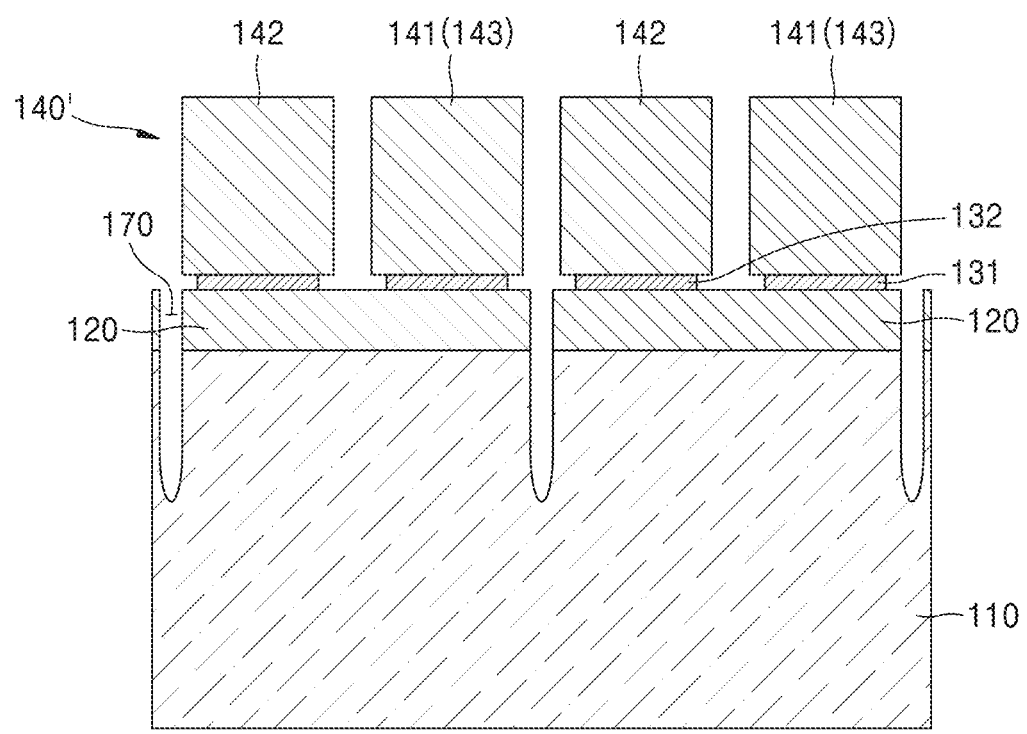
Figure 14:
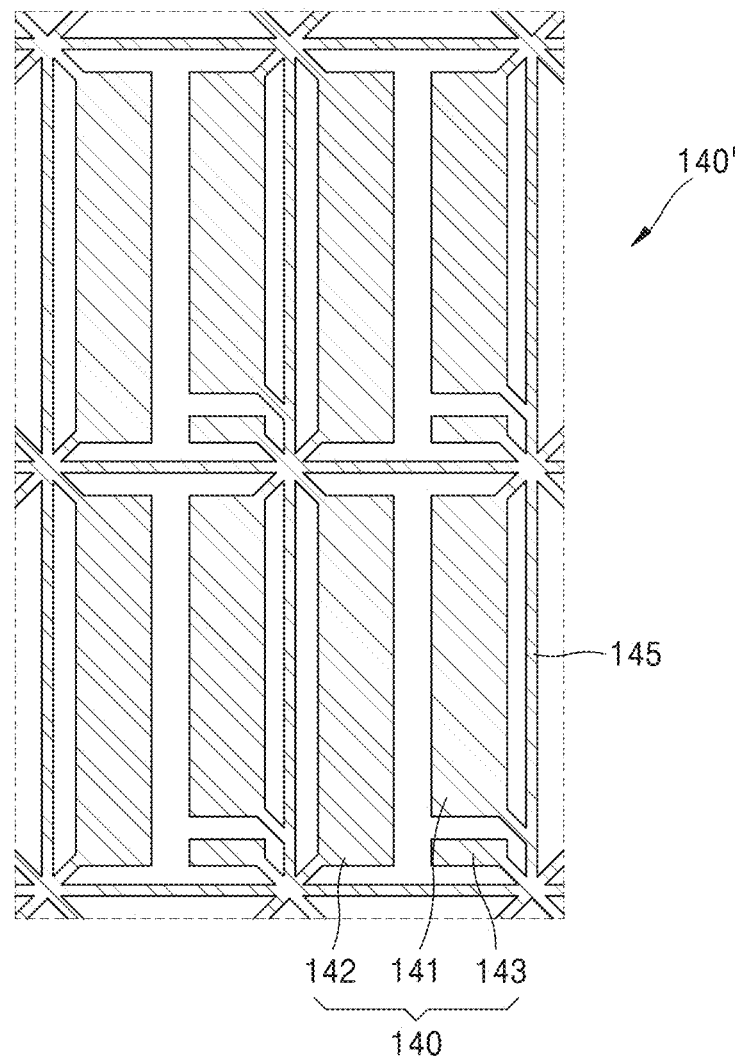

Referring to FIG. 13, a lead frame structure 140' is bonded to upper surfaces of the semiconductor devices 120. FIG. 14 is a plan view illustrating the lead frame structure 140' shown in FIG. 13. Referring to 14, the lead frame structure 140' may include a plurality of lead frames 140 and a connection member 145 connecting the lead frames 140 to each other.

Each of lead frames 140 may include a plurality of conductive members 141, 142, and 143. The plurality of conductive members 141, 142, and 143 may include a material such as copper which has high thermal and electrical conductivity. The plurality of conductive members 141, 142, and 143 include first, second, and third conductive members 141, 142 and 143. Here, the first, second, and third conductive members 141, 142, and 143 may have shapes respectively corresponding to the source electrode pad 131, the drain electrode pad 132, and the gate electrode pad 133.

Figure 15:
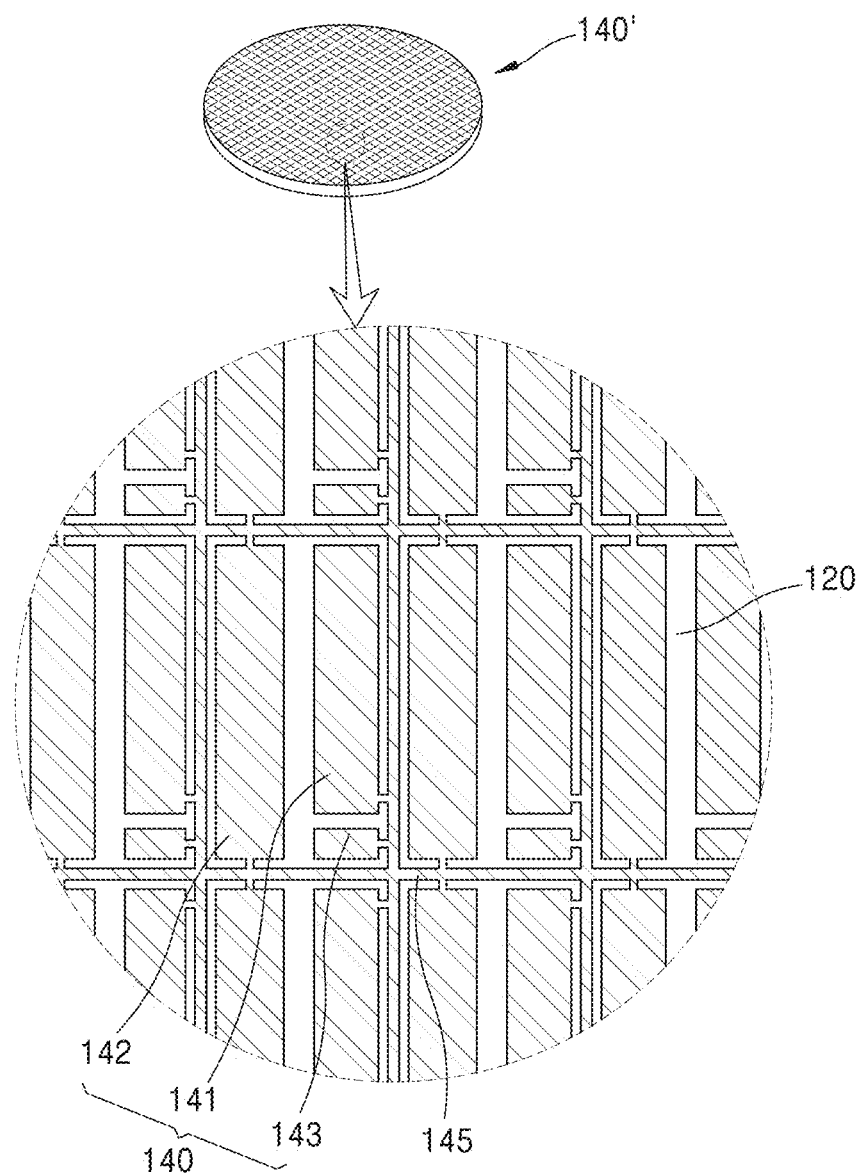

The connection member 145 connecting the lead frames 140 to each other may be formed in one piece with the conductive members 141, 142, and 143. The connection member 145 may include the same material as the conductive members 141, 142, and 143. However, the present disclosure is not limited thereto, and the connection member 145 may not be formed in one piece with the conductive members 141, 142, and 143. In a wafer level packaging process, as shown in FIG. 15, the lead frame structure 140' may be provided in a shape corresponding to the silicon wafer described above.

The lead frame structure 140' is directly bonded to the plurality of electrode pads 131, 132, and 133 provided on the upper surfaces of the semiconductor devices 120. For example, the first conductive members 141 may be bonded to the source electrode pads 131, the second conductive members 142 may be bonded to the drain electrode pads 132, and the third conductive members 143 may be bonded to the gate electrode pads 133. Here, bonding between the conductive members 141, 142, and 143 and the plurality of electrode pads 131, 132, and 133 may be performed by, for example, metal-to-metal bonding or solder bonding. However, this is only an example, and various other bonding methods may be used.

Figure 16:
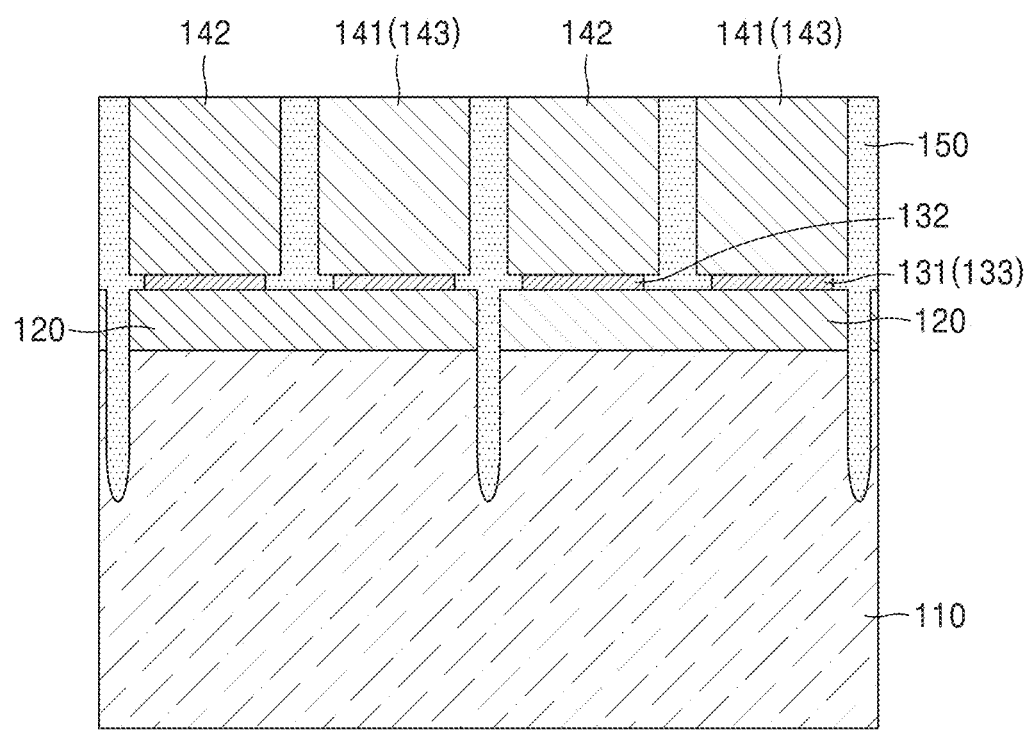
Figure 17:
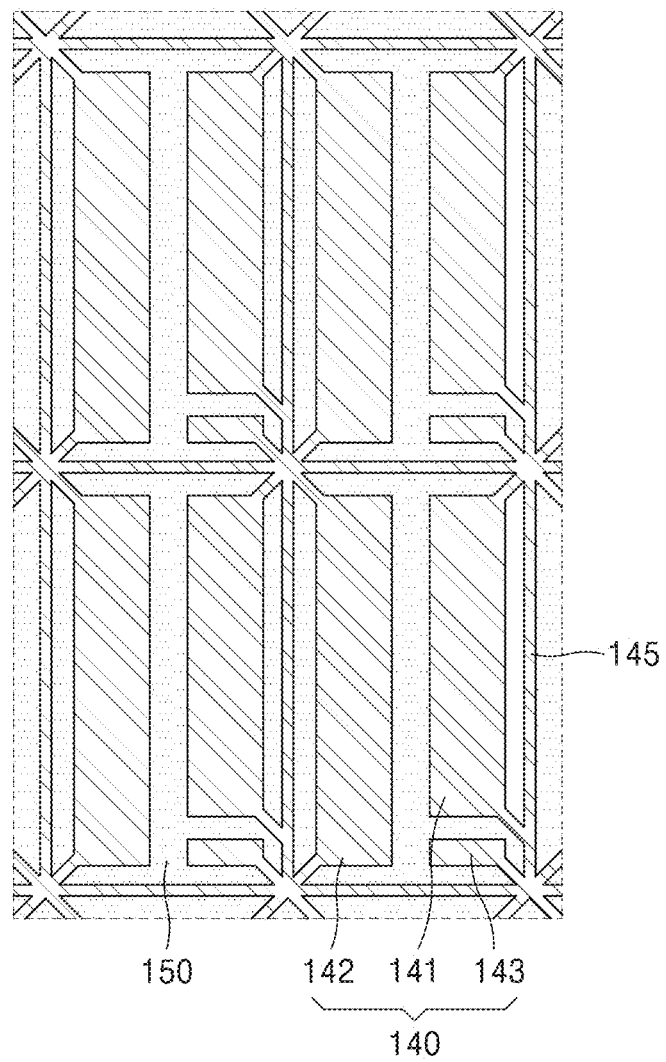

Referring to FIG. 16 and FIG. 17 (top view of FIG. 16), a molding process is performed on the structure shown in FIG. 13. In the molding process, empty spaces of the structure shown in FIG. 13 may be filled with a mold 150. For example, the mold 150 may be provided to fill gaps between the lead frames 140 and gaps between the conductive members 141, 142, and 143 of each of the lead frames 140. In addition, the mold 150 may be provided to cover upper and lateral surfaces of the semiconductor devices 120 and lateral surfaces of the semiconductor substrate 110. In addition, upper surfaces of the lead frames 140 are exposed to the outside.

The mold 150 may include an electrically insulating resin, for example, an epoxy resin. For example, the mold 150 may include an EMC or LMC, but is not limited thereto.

Figure 18:
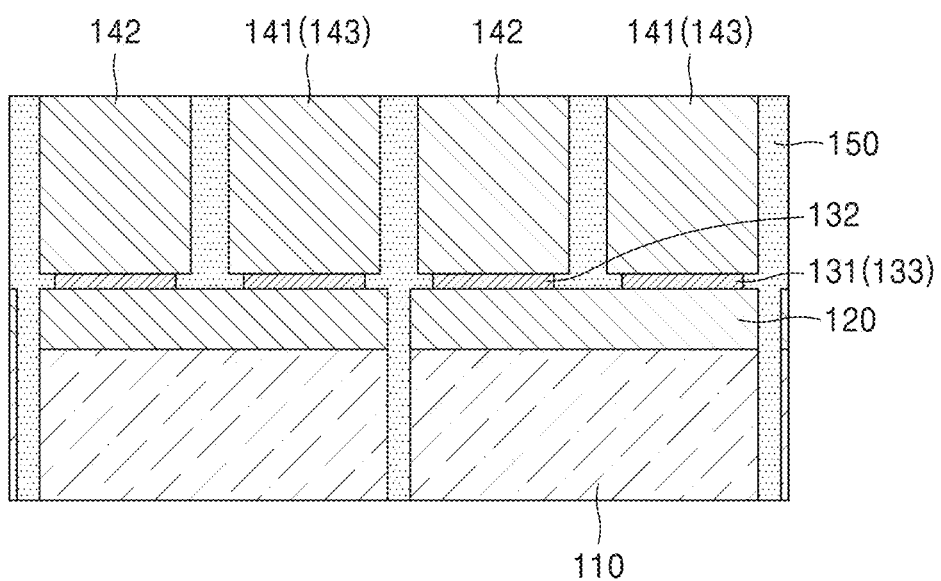

Referring to FIG. 18, the semiconductor substrate 110 is processed such that the semiconductor substrate 110 substantially may have a desired and/or alternatively predetermined thickness. The processing of the semiconductor substrate 110 may be performed by grinding a lower portion of the semiconductor substrate 110 to partially remove the semiconductor substrate 110. In this process, the grooves 170 may be exposed through a lower surface of the semiconductor substrate 110. In some embodiments, a different process than grinding, such as a dry etch or an implant ion-cut process that removes a bottom region of the semiconductor substrate 110, may alternatively be used for processing the semiconductor substrate 110 to reduce the thickness of the semiconductor substrate 110.

Figure 19:
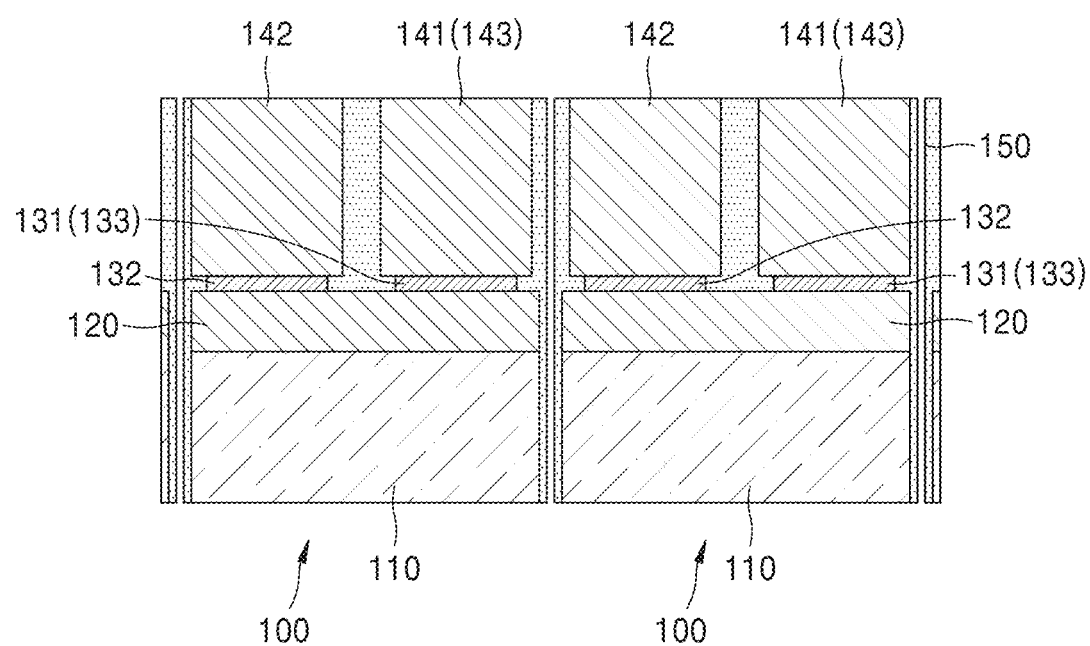

Referring to FIG. 19, a plurality of semiconductor device packages 100 are fabricated by cutting the mold 150 filled between the semiconductor devices 120. The cutting of the mold 150 may be performed, for example, by laser dicing or blade dicing. In this process, the connection member 145 connecting the lead frames 140 may be removed.

In each of the semiconductor device packages 100, the mold 150 may fill the gaps between the conductive members 141, 142, and 143 of the lead frame 140 and may cover lateral surfaces of the lead frame 140. In addition, the mold 150 may cover the upper and lateral surfaces of each of the semiconductor devices 120 and the lateral surfaces of the semiconductor substrate 110.

In the above description, the semiconductor substrate 110 is partially removed by processing the semiconductor substrate 110 until such that the semiconductor substantially 110 may have a desired and/or alternatively predetermined thickness. However, the semiconductor substrate 110 may be entirely removed through a processing process. In this case, lower surfaces of the semiconductor devices 120 may be exposed to the outside.

FIGS. 20 to 26 are views illustrating a method of fabricating semiconductor device packages according to another example embodiment.

Figure 20:
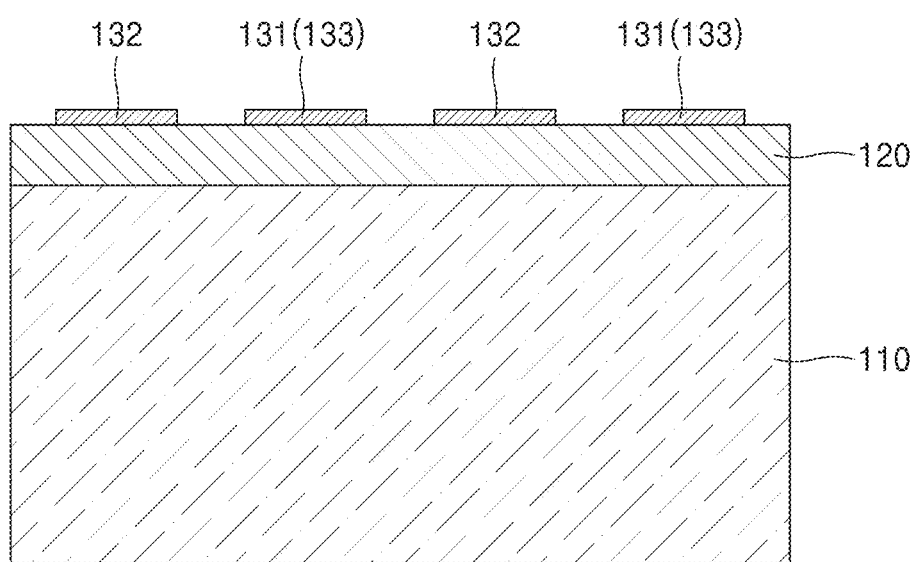
FIGS. 20 to 26 are views illustrating a method of fabricating semiconductor device packages, according to another example embodiment.
Figure 21:
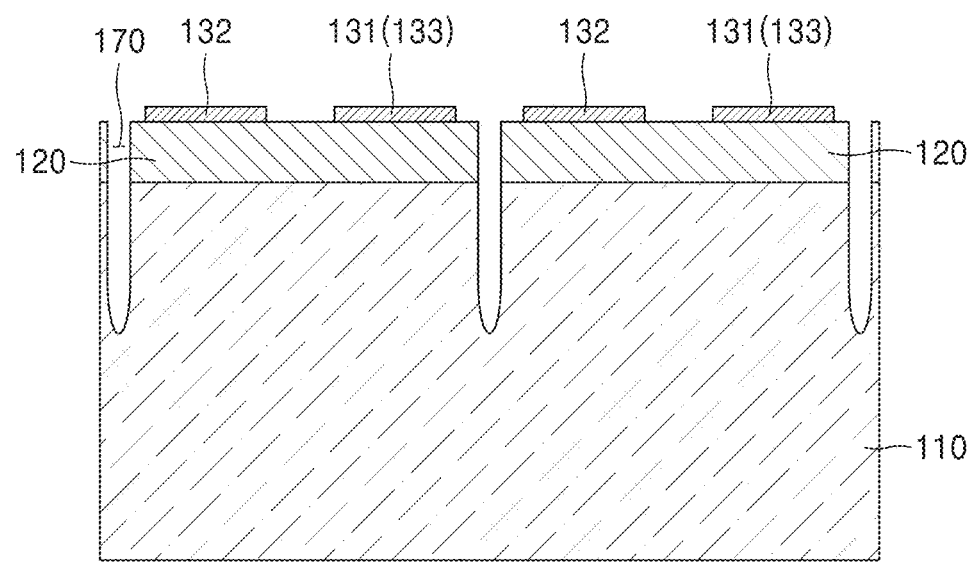

Referring to FIGS. 20 and 21, after preparing a semiconductor substrate 110 on which a plurality of semiconductor devices 120 are provided, grooves 170 for separating the semiconductor devices 120 are formed to a desired and/or alternatively predetermined depth in the semiconductor substrate 110 This has been described with reference to FIGS. 10 to 12.

Figure 22:
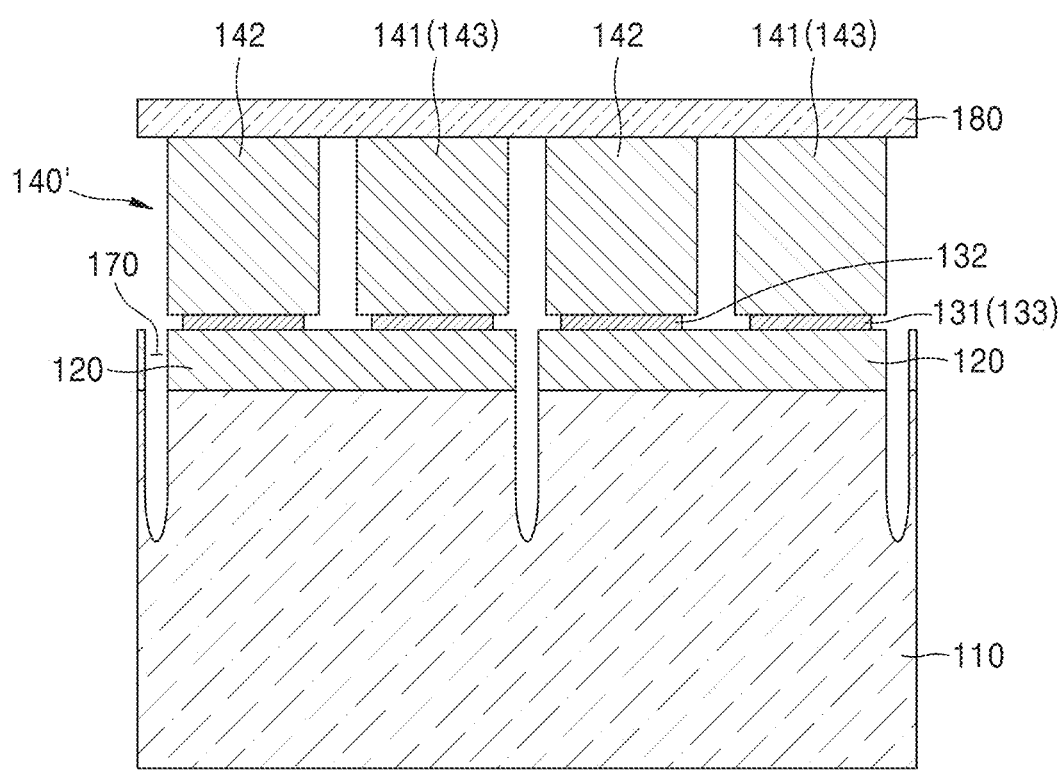

Referring to FIG. 22, a lead frame structure 140' is bonded to upper surfaces of the semiconductor devices 120. Since the lead frame structure 140' has been described above, a description thereof will not be presented here. The lead frame structure 140' may be configured to be attached to a support substrate 180. The support substrate 180 supports the lead frame structure 140' and may thus facilitate a processing process (described later) of the semiconductor substrate 110.

Figure 23:
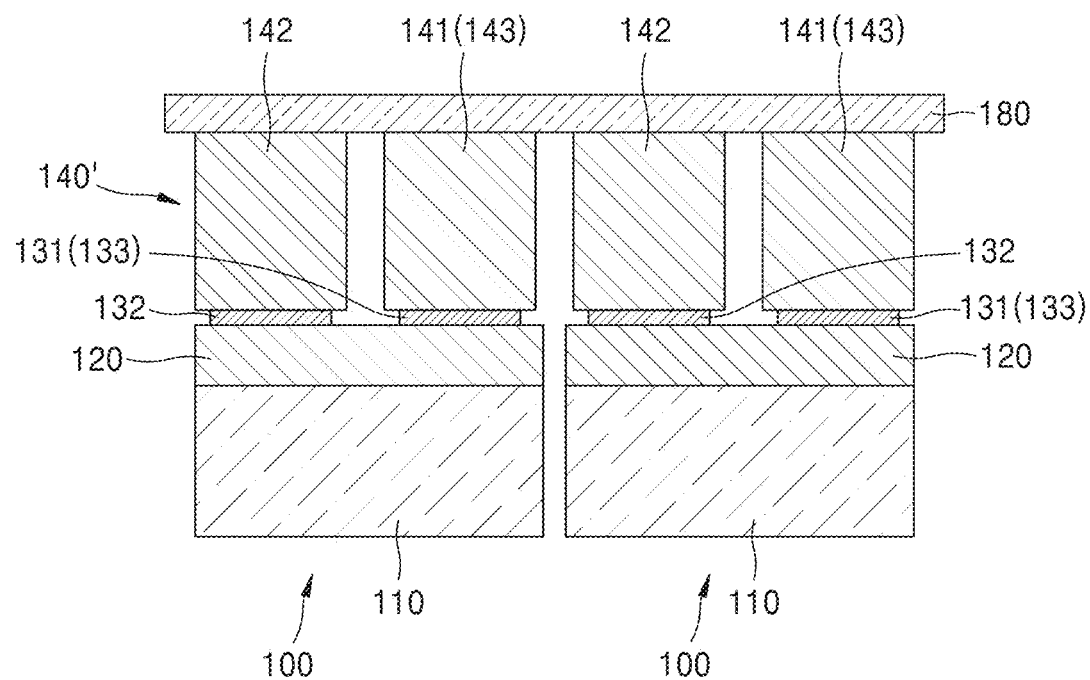

Referring to FIG. 23, the semiconductor substrate 110 is processed from the state shown in FIG. 22 such that the semiconductor substantially 110 may have a desired and/or alternatively predetermined thickness. The processing of the semiconductor substrate 110 may be performed by grinding a lower portion of the semiconductor substrate 110 to partially remove the semiconductor substrate 110. In this process, the grooves 170 may be exposed through a lower surface of the semiconductor substrate 110. Therefore, the semiconductor devices 120 may be spaced apart from each other at regular intervals owing to the grooves 170 formed in the semiconductor substrate 110.

Figure 24:
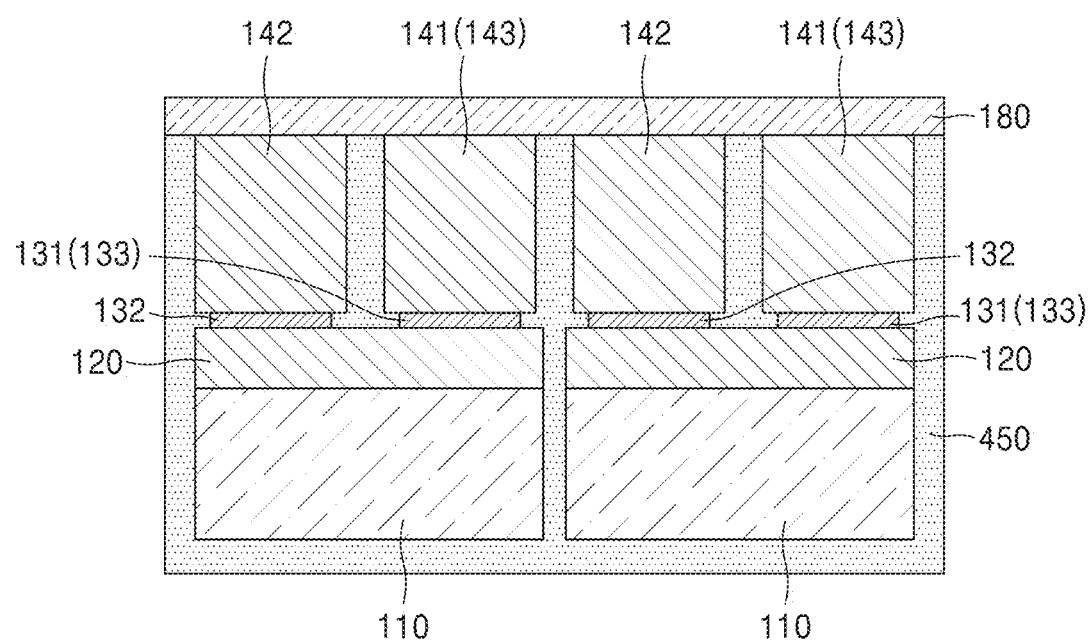

Referring to FIG. 24, a molding process is performed on the structure shown in FIG. 23. In the molding process, empty spaces of the structure shown in FIG. 23 may be filled with a mold 450. For example, the mold 450 may fill gaps between lead frames 140 and gaps between conductive members 141, 142, and 143 of each of the lead frames 140. In addition, the mold 450 may cover upper and lateral surfaces of the semiconductor devices 120, and lateral and lower surfaces of the semiconductor substrate 110.

Figure 25:
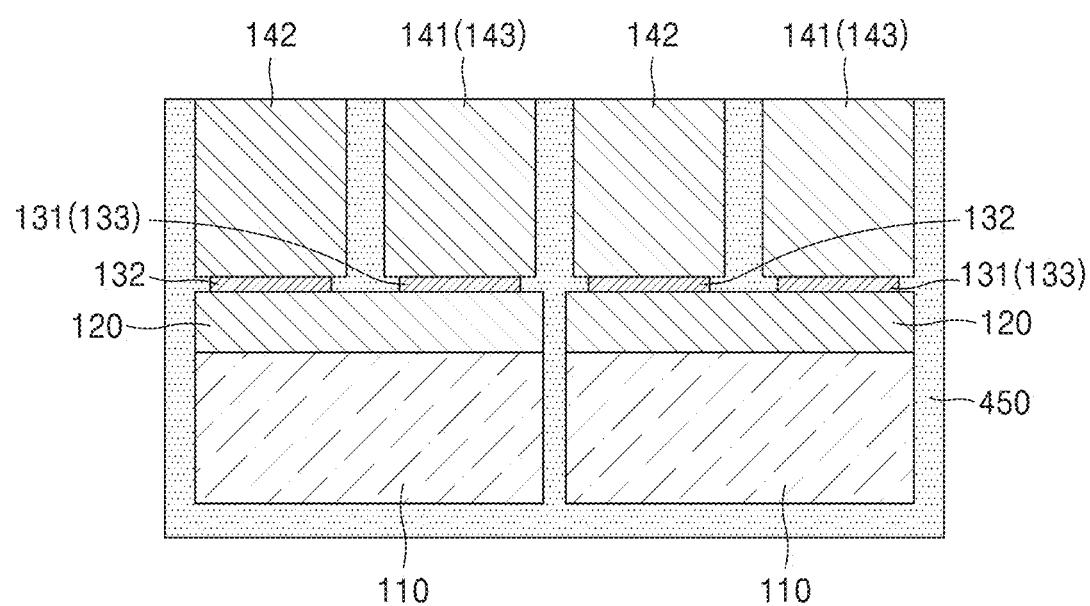

Referring to FIG. 25, the support substrate 180 which supports the lead frame structure 140' is removed. Therefore, upper surfaces of the lead frames 140 may be exposed to the outside.

Figure 26:
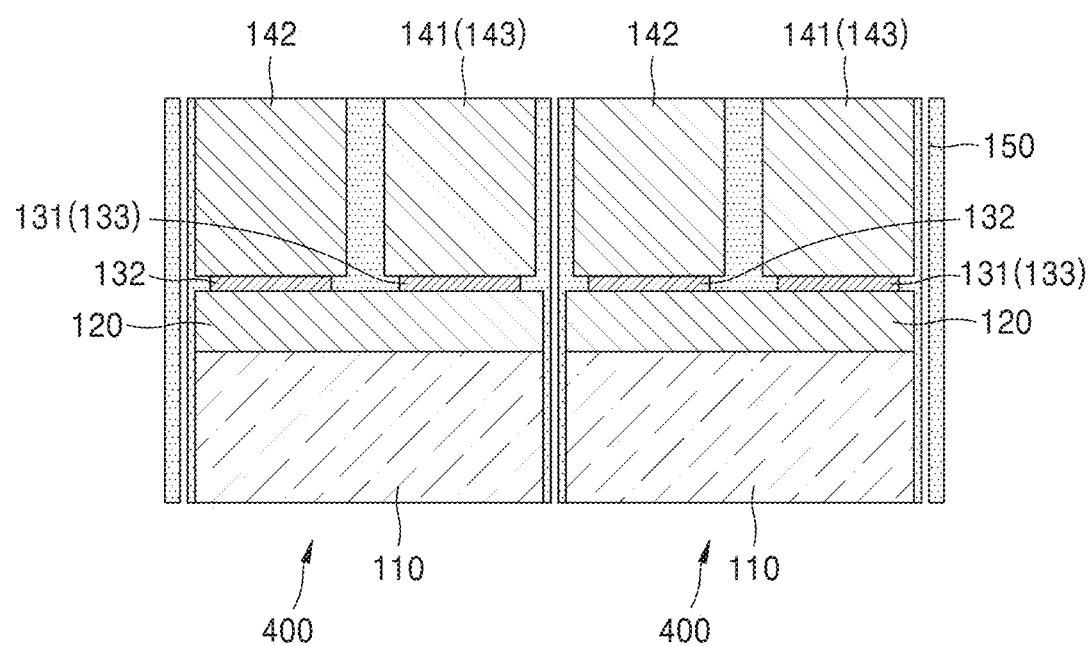

Referring to FIG. 26, a plurality of semiconductor device packages 400 are fabricated by cutting the mold 450 filled between the semiconductor devices 120. In each of the semiconductor device packages 400, the mold 450 may fill the gaps between the conductive members 141, 142, and 143 of the lead frame 140, and may cover lateral surfaces of the lead frame 140. In addition, the mold 450 may cover the upper and lateral surfaces of each of the semiconductor devices 120, and the lateral and lower surfaces of the semiconductor substrate 110.

In the above, the case of partially removing the semiconductor substrate 110 by processing the semiconductor substrate 110 has been described. However, the semiconductor substrate 110 may be entirely removed through a processing process. In this case, the mold 450 may cover upper, lateral, and lower surfaces of the semiconductor devices 120.

FIGS. 27 to 31 are views illustrating a method of fabricating semiconductor device packages according to another example embodiment.

Figure 27:
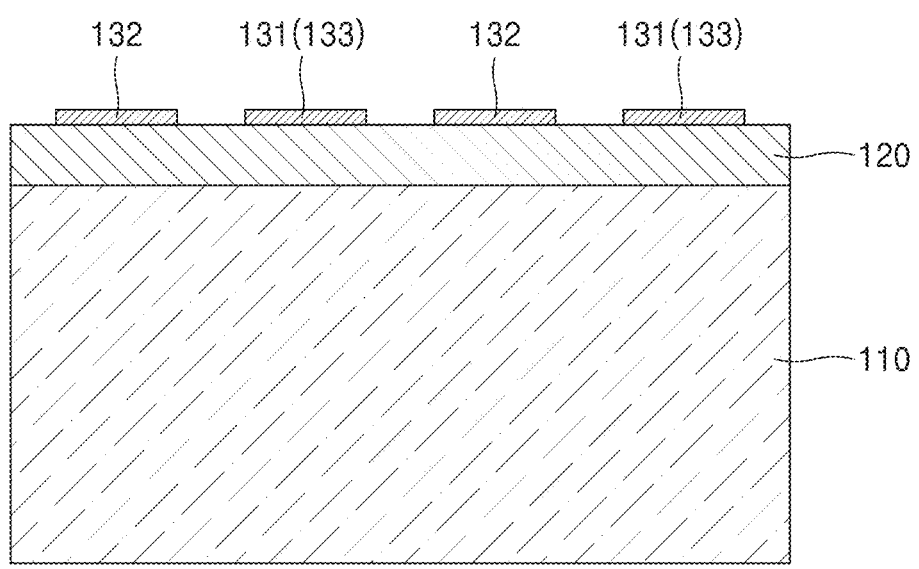
FIGS. 27 to 31 are views illustrating a method of fabricating semiconductor device packages, according to another example embodiment.
Figure 28:
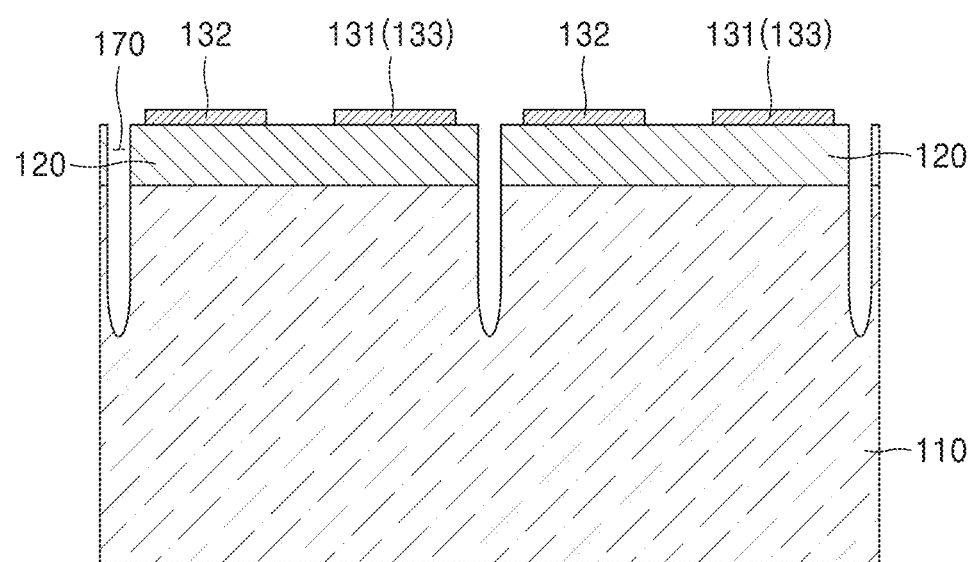

Referring to FIGS. 27 and 28, after preparing a semiconductor substrate 110 on which a plurality of semiconductor devices 120 are provided, grooves 170 for separating the semiconductor devices 120 are formed to a desired and/or alternatively predetermined depth in the semiconductor substrate 110. This has been described with reference to FIGS. 10 to 12.

Figure 29:
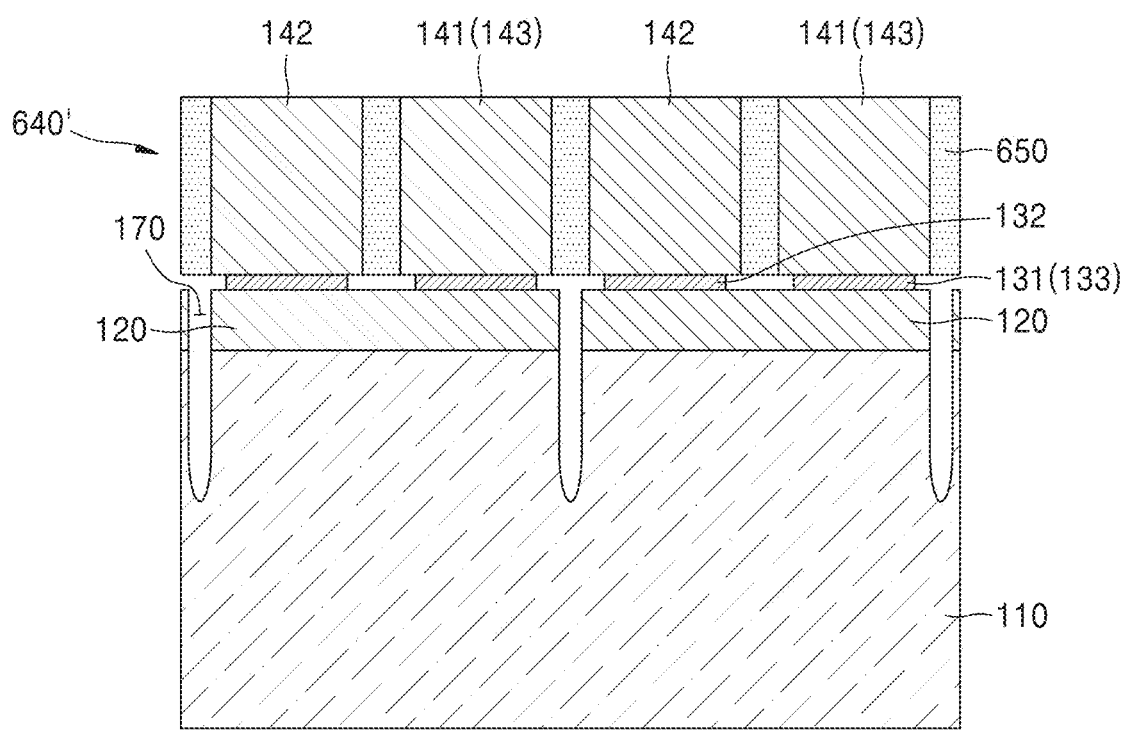

Referring to FIG. 29, a pre-molded lead frame structure 640' is bonded to upper surfaces of the semiconductor devices 120. The pre-molded lead frame structure 640' may be fabricated by performing a molding process on such a lead frame structure as described above. In the pre-molded lead frame structure 640', a mold 650 may fill gaps between lead frames 140 and gaps between conductive members 141, 142, and 143 of each of the lead frames 140.

Figure 30:
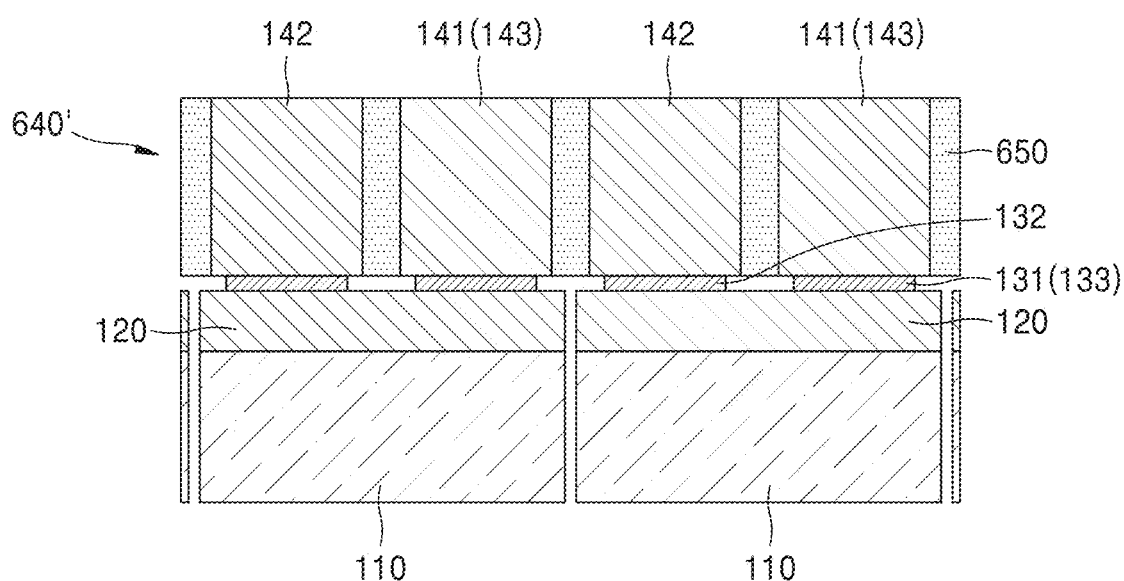

Referring to FIG. 30, the semiconductor substrate 110 is processed from the state shown in FIG. 29 such that the semiconductor substrate 110 may have a desired and/or alternatively predetermined thickness. The processing of the semiconductor substrate 110 may be performed by grinding a lower portion of the semiconductor substrate 110 to partially remove the semiconductor substrate 110. In this process, the grooves 170 may be exposed through a lower surface of the semiconductor substrate 110. The semiconductor devices 120 may be spaced apart from each other at regular intervals owing to the grooves 170 formed in the semiconductor substrate 110.

Figure 31:
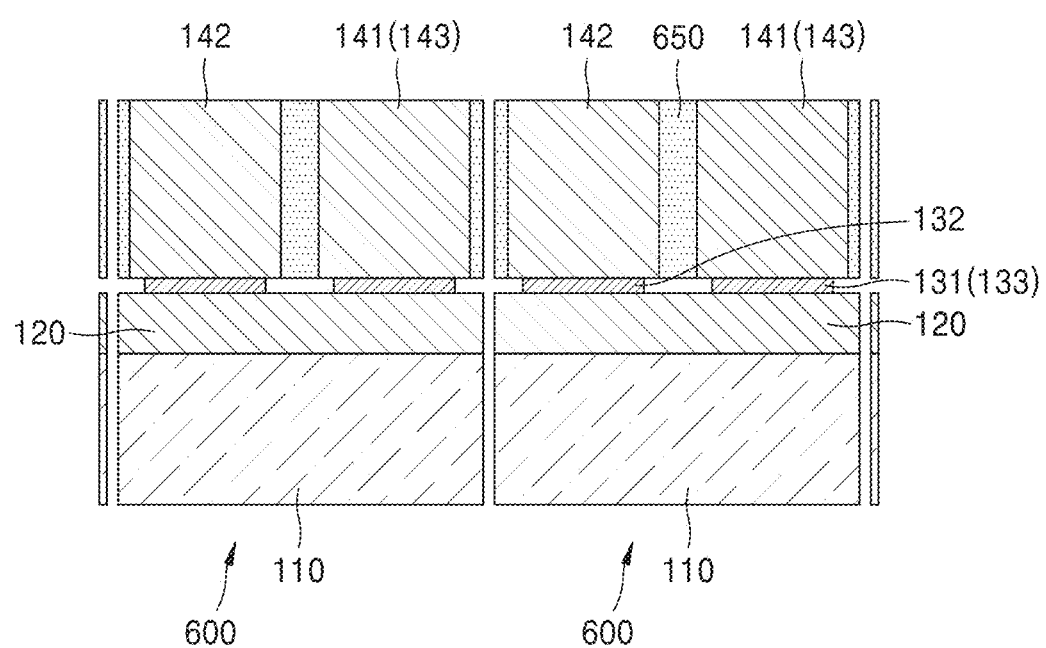

Referring to FIG. 31, a plurality of semiconductor device packages 600 are fabricated by cutting the mold 650 filled between the lead frames 140. In each of the semiconductor device packages 600, the mold 650 may fill the gaps between the conductive members 141, 142, and 143 of the lead frame 140, and may cover lateral surfaces of the lead frame 140.

In the above, the case of partially removing the semiconductor substrate 110 by processing the semiconductor substrate 110 has been described. However, the semiconductor substrate 110 may be entirely removed through a processing process.

FIGS. 32 to 35 are views illustrating a method of fabricating semiconductor device packages according to another example embodiment.

Figure 32:
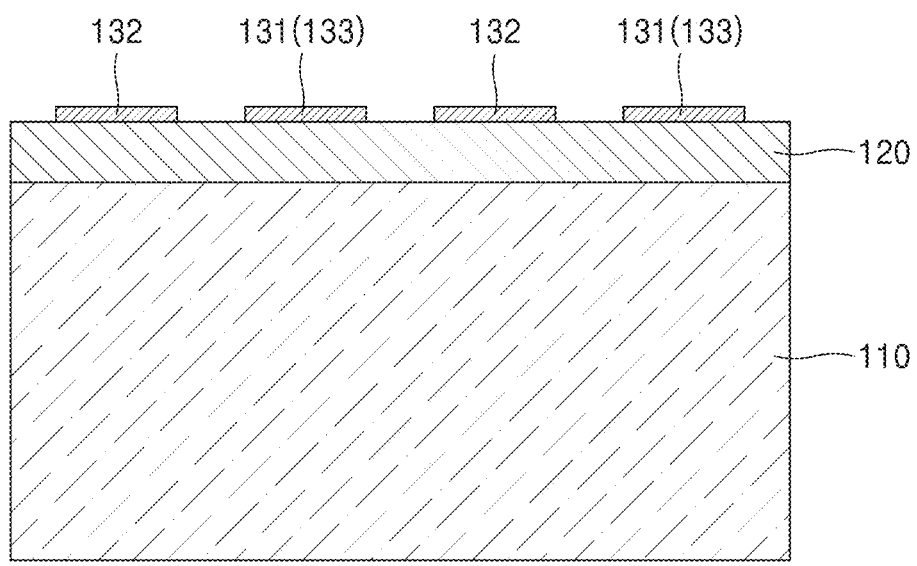
FIGS. 32 to 35 are views illustrating a method of fabricating semiconductor device packages, according to another example embodiment.
Figure 33:
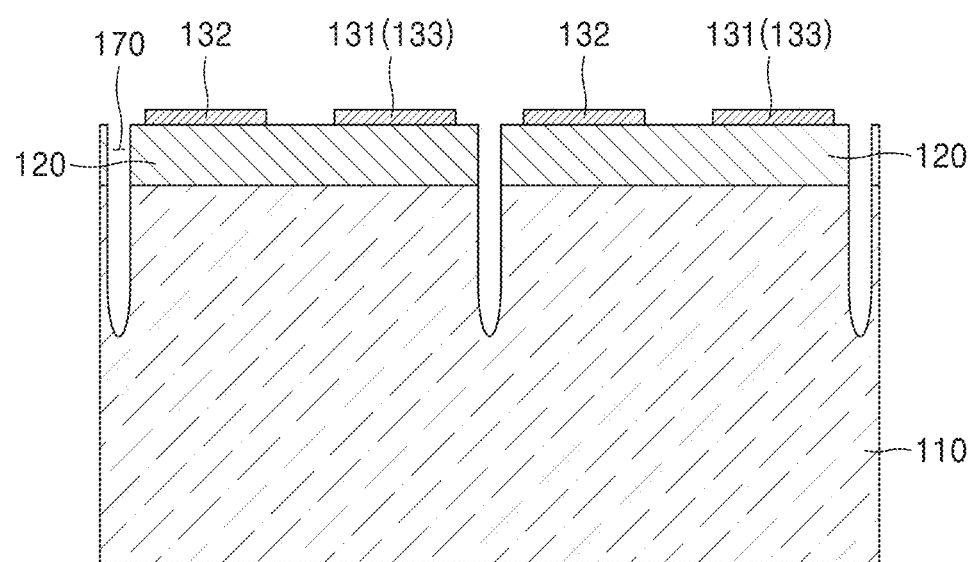
Figure 34:
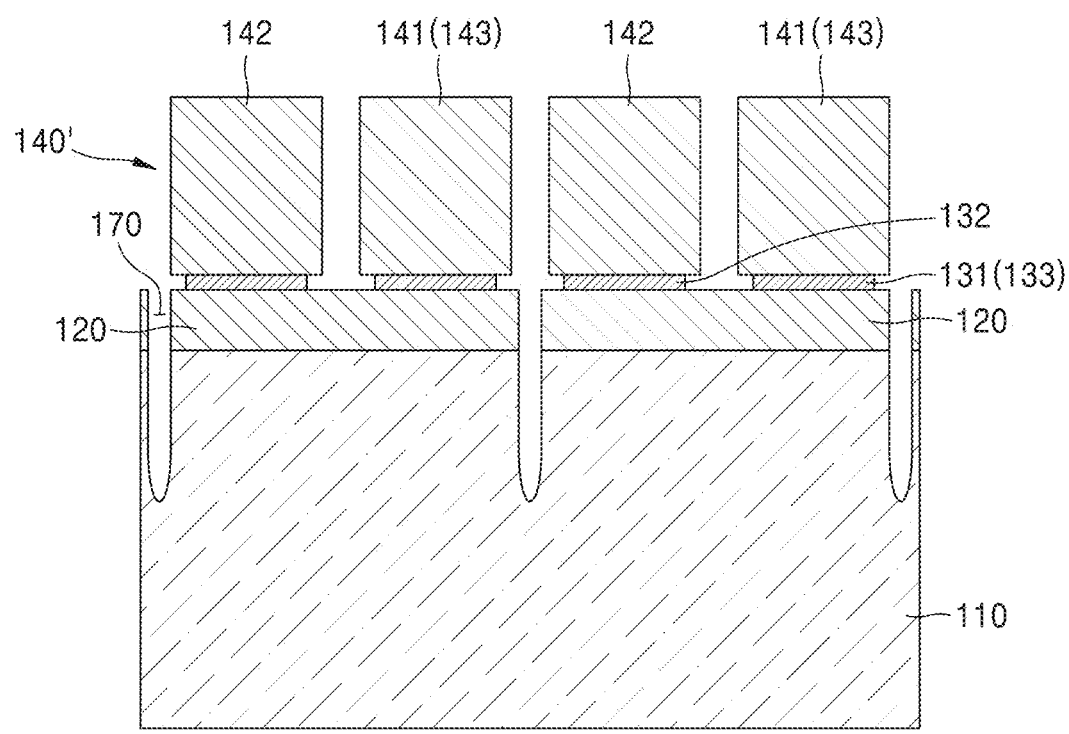

Referring to FIGS. 32 to 34, after preparing a semiconductor substrate 110 on which a plurality of semiconductor devices 120 are provided, grooves 170 for separating the semiconductor devices 120 are formed to a desired and/or alternatively predetermined depth in the semiconductor substrate 110. In addition, a lead frame structure 140' is bonded to upper surfaces of the semiconductor devices 120. This has been described with reference to FIGS. 10 to 15.

Figure 35:
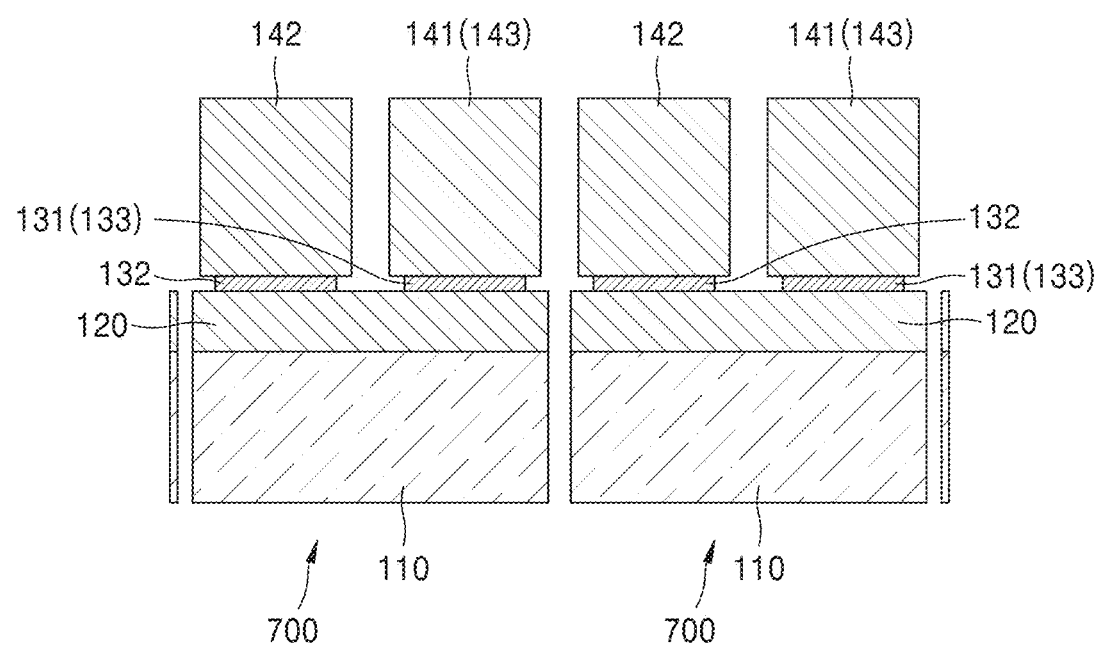

Referring to FIG. 35, a plurality of semiconductor device packages 700 are fabricated by processing the semiconductor substrate 110 from the state shown in FIG. 34 such that the semiconductor substantially 110 may have a desired and/or alternatively predetermined depth. The processing of the semiconductor substrate 110 may be performed by grinding a lower portion of the semiconductor substrate 110 to partially remove the semiconductor substrate 110. In this process, the grooves 170 may be exposed through a lower surface of the semiconductor substrate 110. In the above, the case of partially removing the semiconductor substrate 110 by processing the semiconductor substrate 110 has been described. However, the semiconductor substrate 110 may be entirely removed through a processing process.

According to the example embodiments, process times and costs may be reduced by fabricating semiconductor device packages using a wafer level packaging process. In addition, it is possible to fabricate semiconductor device packages having high heat dissipation characteristics, low parasitic inductance, and improved durability.

As described above, in each of the semiconductor device packages of the above example embodiments, the electrode pads of the semiconductor device and the conductive members of the lead frame are directly bonded to each other without using metal wiring such that heat generated from the semiconductor device may be effectively discharged to the outside, and parasitic inductance caused by metal wiring may be reduced. In addition, owing to the mold provided to protect the lead frame, the semiconductor device, and the semiconductor substrate, durability may be improved against electrical and mechanical shocks. In addition, process times and costs may be reduced by manufacturing semiconductor device packages using a wafer level packaging process.

Figure 36:
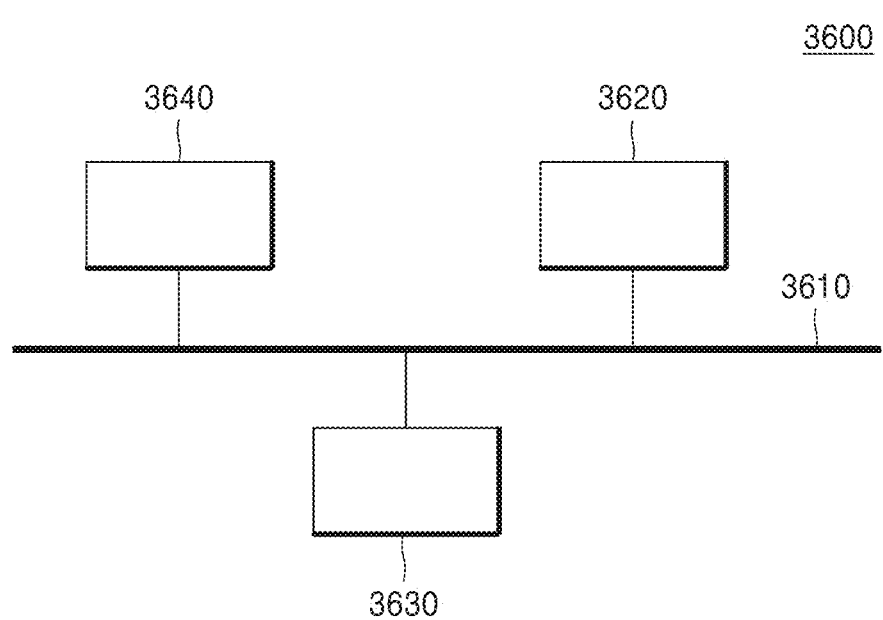
FIG. 36 is a schematic of an electronic device according to an embodiment.

FIG. 36 is a schematic of an electronic device according to an embodiment.

As shown, the electronic device 3600 includes one or more electronic device components, including a processor (e.g., processing circuitry) 3620 and a memory 3630 that are communicatively coupled together via a bus 3610.

The processing circuitry 3620, may include and/or may be implemented by processing circuitry such as hardware including logic circuits, a hardware/software combination such as a processor executing software; or a combination thereof. For example, the processing circuitry 2320 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 3630 may include a non-transitory computer readable storage device, for example a solid state drive (SSD), storing a program of instructions, and the processing circuitry 3620 may be configured to execute the program of instructions to implement the functionality of the electronic device 3600.

In some example embodiments, the electronic device 3600 may include one or more additional components 3640, coupled to bus 3610, which may include, for example, a power supply, a light sensor, a light-emitting device, any combination thereof, or the like. In some example embodiments, one or more of the processing circuitry 3620, memory 3630, or one or more additional components 3640 may include any one of the above-discussed semiconductor packages 100, 200, 300, 400, 500, and 600 in FIGS. 1 to 9 described herein to provide an electronic device 3600 having improved heat dissipation and/or reduced parasitic inductance caused by metal wiring.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device package comprising:
a semiconductor device having a horizontal channel structure, the semiconductor device including a plurality of electrode pads on an upper surface of the semiconductor device;
a lead frame including a plurality of conductive members; and
a mold between the plurality of conductive members, wherein the plurality of electrode pads include a source electrode pad, a drain electrode pad, and a gate electrode pad on the upper surface of the semiconductor device,
the plurality of conductive members are bonded directly to the source electrode pad, the drain electrode pad, and the gate electrode pad, respectively, without metal wiring, and
the source electrode pad is directly electrically connected to a source electrode of the semiconductor device, the drain electrode pad is directly electrically connected to a drain electrode of the semiconductor device, and the gate electrode pad is directly electrically connected to a gate electrode of the semiconductor device, without metal wiring.

2. The semiconductor device package of claim 1, wherein the mold covers a lateral surface of the lead frame and a lateral surface of the semiconductor device.

3. The semiconductor device package of claim 2, wherein the mold further covers a lower surface of the semiconductor device.

4. The semiconductor device package of claim 1, further comprising:
a semiconductor substrate, wherein
the semiconductor device is on an upper surface of the semiconductor substrate.

5. The semiconductor device package of claim 4, wherein the mold covers a lateral surface of the lead frame, a lateral surface of the semiconductor device, and a lateral surface of the semiconductor substrate.

6. The semiconductor device package of claim 5, wherein a lower surface of the semiconductor substrate is exposed without being covered by the mold.

7. The semiconductor device package of claim 5, wherein the mold covers a lower surface of the semiconductor substrate.

8. The semiconductor device package of claim 1, further comprising solder bumps on the plurality of conductive members.

9. The semiconductor device package of claim 1, further comprising:
a heat sink on the semiconductor device.

10. The semiconductor device package of claim 1, wherein the semiconductor device comprises a GaN power device.

11. A method of fabricating semiconductor device packages, the method comprising:
preparing a semiconductor substrate including a plurality of semiconductor devices having a horizontal channel structure;
forming a groove in the semiconductor substrate, the groove having a depth to separate the plurality of semiconductor devices from each other;
bonding a lead frame structure to the plurality of semiconductor devices, the lead frame structure including a plurality of lead frames;
processing the semiconductor substrate to change the semiconductor substrate from a first thickness to a second thickness less than the first thickness; and
fabricating a plurality of semiconductor device packages from the semiconductor substrate including the plurality of semiconductor devices after the processing the semiconductor substrate, wherein
an upper surface of each of the plurality of semiconductor devices includes a plurality of electrode pads thereon, the plurality of electrode pads including a source electrode pad, a drain electrode pad, and a gate electrode pad,
each corresponding lead frame of the plurality of lead frames comprises a plurality of conductive members bonded directly to the source electrode pad, the drain electrode pad, and the gate electrode pad, respectively, without using metal wiring, and
the source electrode pad is directly electrically connected to a source electrode of the semiconductor device, the drain electrode pad is directly electrically connected to a drain electrode of the semiconductor device, and the gate electrode pad is directly electrically connected to a gate electrode of the semiconductor device, without using metal wiring.

12. The method of claim 11, wherein
the semiconductor substrate comprises a silicon wafer before the processing the semiconductor substrate, and
the lead frame structure has a shape corresponding to the silicon wafer.

13. The method of claim 11, wherein the groove in the semiconductor substrate is formed by etching, laser dicing, or blade dicing.

14. The method of claim 11, wherein the processing the semiconductor substrate is performed by partially removing the semiconductor substrate or entirely removing the semiconductor substrate.

15. The method of claim 11, further comprising:
filling a mold between the plurality of conductive members and in the groove, wherein
the filling the mold is performed after the bonding the lead frame structure.

16. The method of claim 15, wherein the fabricating the plurality of semiconductor device packages includes cutting the mold filled between the plurality of semiconductor devices.

17. The method of claim 11, wherein the lead frame structure is attached to and supported by a support substrate.

18. The method of claim 17, wherein after the processing of the semiconductor substrate, the method further comprises:
filling a mold between the plurality of conductive members and in the groove; and
removing the support substrate.

19. The method of claim 18, wherein the mold covers a lower surface of the semiconductor substrate or lower surfaces of the plurality of semiconductor devices.

20. The method of claim 18, wherein the fabricating the plurality of semiconductor device packages includes cutting the mold filled between the plurality of semiconductor devices.

21. The method of claim 11, wherein the lead frame structure includes a mold filled between the plurality of conductive members of each of the plurality of lead frames.

22. The method of claim 21, wherein the fabricating the plurality of semiconductor device packages includes cutting the mold filled between the plurality of lead frames.

23. A semiconductor device package comprising:
a semiconductor device including a source electrode pad, a drain electrode pad, and a gate electrode pad spaced apart from each other on an upper surface of the semiconductor device;
a lead frame including a first conductive member bonded directly to the source electrode pad, a second conductive member bonded directly to the drain electrode pad, and a third conductive member bonded directly to the gate electrode pad without using metal wiring; the first conductive member to the third conductive member being spaced apart from each other; and
a mold surrounding a lateral surface the first conductive member, a lateral surface of the second conductive member, a lateral surface of the third conductive member,
wherein the source electrode pad is directly electrically connected to a source electrode of the semiconductor device, the drain electrode pad is directly electrically connected to a drain electrode of the semiconductor device, and the gate electrode pad is directly electrically connected to a gate electrode of the semiconductor device, without metal wiring.

24. The semiconductor device of claim 23, wherein
the mold surrounds a lateral surface of the source electrode pad, a lateral surface of the drain electrode pad, and a lateral surface of the gate electrode pad such that the mold fills gaps between the source electrode pad, the drain electrode pad, and the gate electrode pad along the upper surface of the semiconductor device.

25. The semiconductor device of claim 23, wherein the mold surrounds a lateral surface of the semiconductor device.

26. The semiconductor device of claim 23, further comprising:
a heat sink connected to the semiconductor device.

27. The semiconductor device of claim 23, wherein the semiconductor device comprises a GaN power device.

\* \* \* \* \*